(12) United States Patent
Sugiyama et al.

(10) Patent No.: US 7,796,423 B2
(45) Date of Patent: Sep. 14, 2010

(54) RECONFIGURABLE LOGIC CIRCUIT

(75) Inventors: Hideyuki Sugiyama, Kawasaki (JP);
Mizue Ishikawa, Yokohama (JP);
Tomoaki Inokuchi, Kawasaki (JP);
Yoshiaki Saito, Kawasaki (JP);
Tetsufumi Tanamoto, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 82 days.

(21) Appl. No.: 12/339,638

(22) Filed: Dec. 19, 2008

(65) Prior Publication Data

US 2009/0179667 A1 Jul. 16, 2009

(30) Foreign Application Priority Data

Jan. 11, 2008 (JP) ............... 2008-004192

(51) Int. Cl.
*G11C 11/00* (2006.01)

(52) U.S. Cl. .......... 365/158; 365/189.02; 365/209; 365/171; 326/38; 326/47; 326/113

(58) Field of Classification Search ............ 326/37–41, 326/47, 113; 365/158, 189.011–189.214, 365/230.01–232

See application file for complete search history.

(56) References Cited

U.S. PATENT DOCUMENTS 5,565,695 A * 10/1996 Johnson ............ 257/295
6,885,579 B2 * 4/2005 Sakimura et al. ........... 365/158
7,019,557 B2   3/2006 Madurawe
7,031,184 B2 * 4/2006 Iwata ............... 365/158
2008/0205119 A1* 8/2008 Nagai et al. ............ 365/148

FOREIGN PATENT DOCUMENTS

JP   2007-184959   7/2007

OTHER PUBLICATIONS

U.S. Appl. No. 12/200,169, filed Aug. 28, 2008 Inokuchi, et al.
Satoshi Sugahara, et al., "Spin MOSFETs as a Basis for Spintronics", ACM Transactions on Storage, vol. 2, No. 2, May 2006, pp. 197-219.
U.S. Appl. No. 12/404,606, filed Mar. 16, 2009 Tanamoto, et al.

* cited by examiner

*Primary Examiner*—Vibol Tan
*Assistant Examiner*—Jany Tran
(74) *Attorney, Agent, or Firm*—Oblon, Spivak, McClelland, Maier & Neustadt, L.L.P.

(57) ABSTRACT

It is made possible to provide a reconfigurable logic circuit with which high integration can be achieved. A reconfigurable logic circuit includes: a multiplexer which includes a plurality of spin MOSFETs each having a source and drain containing a magnetic material, and a selecting portion including a plurality of MOSFETs and selecting a spin MOSFET from the plurality of spin MOSFETs, based on control data transmitted from control lines; a determining circuit which determines whether magnetization of the magnetic material of the source and drain of a selected spin MOSFET, which is selected by the selecting portion, is in a first state or in a second state; and a first and second write circuits which put the magnetization of the magnetic material of the source and drain of the selected spin MOSFET into the second and first states respectively by supplying a write current flowing between the source and drain of the selected spin MOSFET.

16 Claims, 19 Drawing Sheets

RECONFIGURABLE LOGIC CIRCUIT

CROSS-REFERENCE TO RELATED APPLICATION

This application is based upon and claims the benefit of priority from prior Japanese Patent Application No. 2008-4192 filed on Jan. 11, 2008 in Japan, the entire contents of which are incorporated herein by reference.

BACKGROUND OF THE INVENTION

1. Field of the Invention

The present invention relates to a reconfigurable logic circuit.

2. Related Art

In recent years, active studies have been made to develop spin electronics devices that utilize the degree of freedom of electron spin. An increasing number of developments based on tunnel magnetoresistance (TMR) are being made, and such developments are now being applied to magnetic random access memories, reproduction heads for hard disk drives (HDD), and the likes. Furthermore, attention is drawn to spin transistors that combine semiconductors and magnetic materials.

Typical examples of suggested spin transistors include a diffusion spin transistor (also known as a Mark Johnson type), a spin orbit control spin transistor (also known as a Supriyo Datta type), a spin-valve transistor, a single-electron spin transistor, and a resonant spin transistor.

There has also been a suggested spin transistor of a MOS structure that has the source and drain made of a magnetic material, and has a point contact formed between the channel and the drain. This point contact is of such a size as to cause a quantum effect for spin-polarized electrons, and has much higher resistance than the channel resistance. The interface resistance between the channel and the drain is the principal factor to determine the magnetization dependency of the drain current. Accordingly, with this spin transistor, a higher magnetoresistance ratio (MR ratio) can be achieved.

Further, there is a suggested reconfigurable logic circuit that includes combinations of MRAMs and MOSFETs forming basic logic gates such as AND gates and OR gates. By changing the storage state of each MRAM with the use of those basic logic gates, the reconfigurable logic circuit can control the validity or invalidity of those logic gates. In a reconfigurable logic circuit, changes can be made to the logics of the circuits after the hardware is formed. Accordingly, defects can be eliminated, and a learning function can be provided by reconfiguring the logic circuits.

One of the reconfigurable logic circuits developed on the basis of today's semiconductor techniques is an integrated circuit called a FPGA (Field Programmable Gate Array). The FPGA stores information in internal SRAM memories. In accordance with the contents of the information stored in the memories, the FPGA controls the logics and wire connections of the reconfigurable logic circuit. As the logics can be changed by software, changes can be made to the circuits after the hardware is formed. Accordingly, this technique is now increasingly used so as to produce increasingly-sophisticated integrated circuits at lower costs on short notice.

A look-up table circuit is a circuit that has logics stored in memories, and generates an output in accordance with the contents stored in the memories. A logic circuit including such a look-up table circuit is a reconfigurable logic circuit that can cope with any logic. However, since such a logic circuit includes a large number of elements, it is difficult to achieve high integration with the use of such logic circuits (see JP-A 2007-184959 (KOKAI) and U.S. Pat. No. 7,019,557).

In a case where a look-up table circuit is to be produced by a semiconductor CMOS technique, SRAMs are used as the memory to store information. As a result, the number of elements in the look-up table circuit becomes large. Also, the multiplexer used in such a look-up table circuit requires a large number of elements. Therefore, the circuit size of the look-up table circuit becomes very large, and becomes one of the factors that hinder high integration. Furthermore, SRAMS are volatile memories that lose information when the power supply is switched off, and it is necessary to write the information stored in an external memory, every time the power supply is switched on. This leads to the troublesome and time-consuming process required at the time of power activation. It is also necessary to secure the external memory to store information when the power supply is switched off, and larger power consumption and capacity are required for the external memory. This is one of the factors that hinder high integration and a reduction of power consumption in the entire system.

In a case of a 4-to-1 look-up table circuit that is normally used in a FPGA, the number of elements is approximately 166. Among the elements, the SRAMs account for approximately 96 elements. A look-up table circuit is an essential circuit in each FPGA. Therefore, if the number of elements in each look-up table circuit included in large numbers in a chip is reduced, higher integration can be realized.

SUMMARY OF THE INVENTION

The present invention has been made in view of these circumstances, and an object thereof is to provide a reconfigurable logic circuit with which high integration can be achieved.

A reconfigurable logic circuit according to an aspect of the present invention includes: a plurality of control lines which are able to transmit control data individually; a multiplexer which includes a plurality of spin MOSFETs each having a source and drain containing a magnetic material, and a selecting portion including a plurality of MOSFETs and selecting a spin MOSFET from the plurality of spin MOSFETs, based on the control data transmitted from the control lines; a determining circuit which determines whether magnetization of the magnetic material of the source and drain of a selected spin MOSFET, which is selected by the selecting portion, is in a first state or in a second state different from the first state, the determining circuit outputting a determination result; a first write circuit which puts the magnetization of the magnetic material of the source and drain of the selected spin MOSFET into the second state by supplying a write current flowing between the source and drain of the selected spin MOSFET; and a second write circuit which puts the magnetization of the magnetic material of the source and drain of the selected spin MOSFET into the first state by supplying a write current flowing between the source and drain of the selected spin MOSFET.

DETAILED DESCRIPTION OF THE INVENTION

The following is a detailed description of embodiments of the present invention, with reference to the accompanying drawings. It should be noted that the drawings are only schematic, and the sizes of the components, the voltages, the lengths of the time periods, the size ratios between components, the voltage ratios, and the time intervals differ from those in reality. Also, some of the components have different sizes and ratios among the drawings.

First Embodiment

Figure 1:
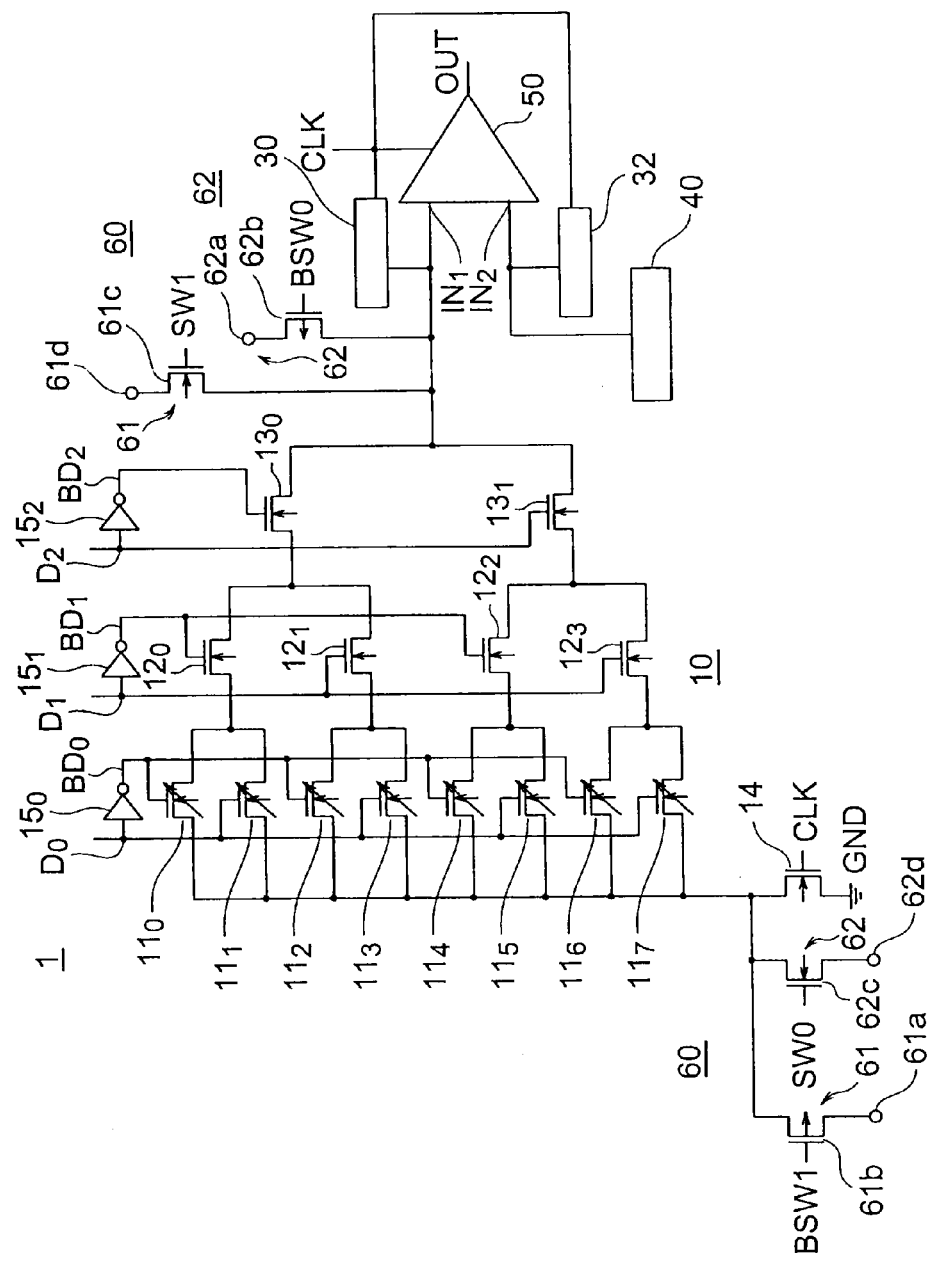
FIG. 1 is a circuit diagram of a look-up table circuit of a reconfigurable logic circuit according to a first embodiment.
Figure 2:
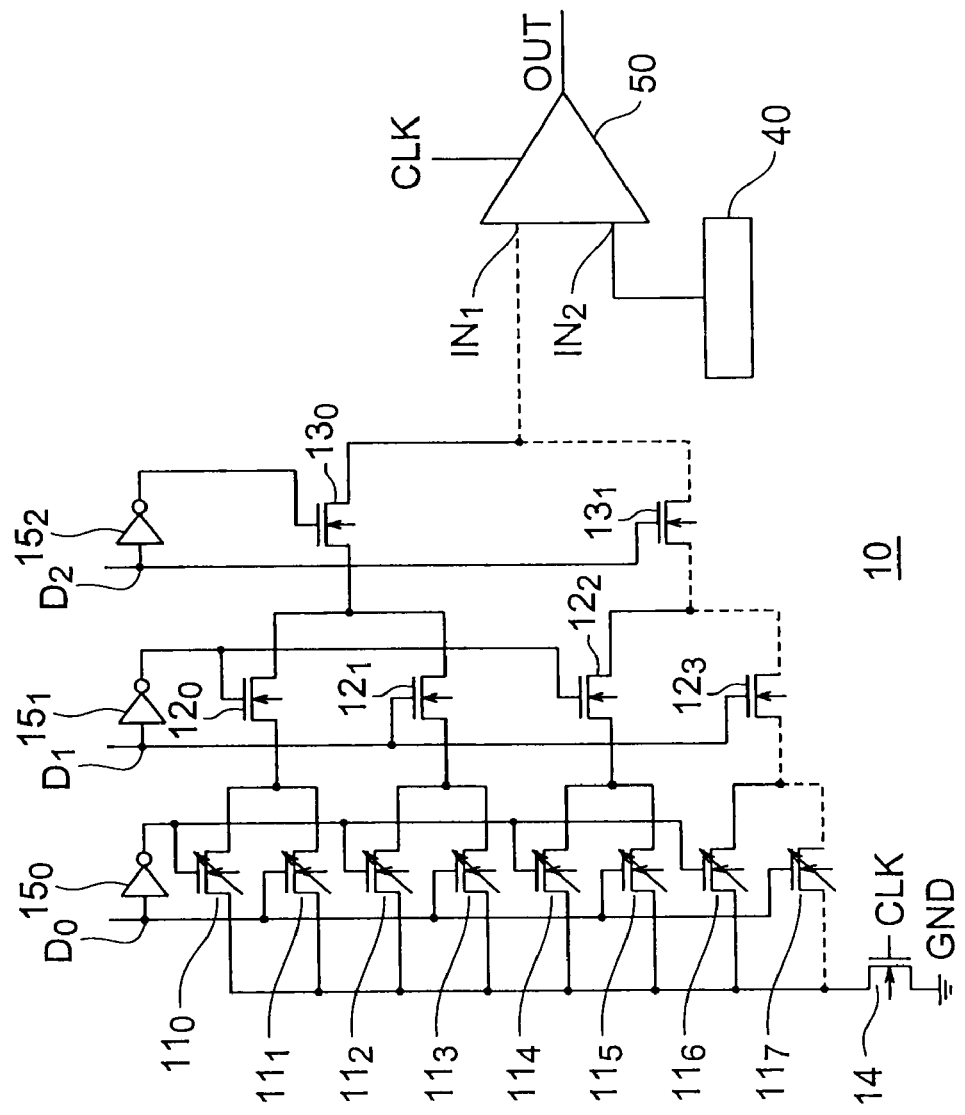
FIG. 2 illustrates a conduction state of the multiplexer in the logic circuit shown in FIG. 1.

Referring to FIGS. 1 to 9, a reconfigurable logic circuit in accordance with a first embodiment of the present invention is described. The reconfigurable logic circuit of this embodiment has a look-up table circuit, and FIG. 1 shows the look-up table circuit. The look-up table circuit 1 in accordance with this embodiment includes a multiplexer 10, current supply sources 30 and 32, a reference portion 40, a comparator 50, and a write circuit 60.

The multiplexer 10 of this embodiment is an 8-to-1 multiplexer that includes three control lines $D_0$, $D_1$, and $D_2$, eight n-type spin MOSFETs $11_0$ to $11_7$, four n-type MOSFETs $12_0$ to $12_3$, two n-type MOSFETs $13_0$ and $13_1$, an n-type MOSFET 14, three inverters $15_0$, $15_1$, and $15_2$, and three inversion control lines $BD_0$, $BD_1$, and $BD_2$.

Each inverter $15_i$ (i=0, 1, or 2) has an input terminal connected to a control line $D_i$, and an output terminal connected to an inversion control line $BD_i$. Accordingly, a control signal flowing through an inversion control line $BD_i$ is the inversion control signal of the control signal flowing through the control line $D_i$.

The eight spin MOSFETs $11_0$ to $11_7$ have the respective sources connected to a ground power supply GND via the MOSFET 14. A clock signal CLK is input to the gate of the MOSFET 14. The four spin MOSFETs $11_0$, $11_2$, $11_4$, and $11_6$ have the respective gates connected to the inversion control line $BD_0$, and the four spin MOSFETs $11_1$, $11_3$, $11_5$, and $11_7$ have the respective gates connected to the control line $D_0$.

The two spin MOSFETs $11_0$ and $11_1$ have the respective drains connected to the source of the MOSFET $12_0$, the two spin MOSFETs $11_2$ and $11_3$ have the respective drains connected to the source of the MOSFET $12_1$, the two spin MOSFETs $11_4$ and $11_5$ have the respective drains connected to the source of the MOSFET $12_2$, and the two spin MOSFETs $11_6$ and $11_7$ have the respective drains connected to the source of the MOSFET $12_3$.

The two MOSFETs $12_0$ and $12_2$ have the respective gates connected to the inversion control line $BD_1$, and the two MOSFETs $12_1$ and $12_3$ have the respective gates connected to the control line $D_1$. The two MOSFETs $12_0$ and $12_1$ have the respective drains connected to the source of the MOSFET $13_0$, and the two MOSFETs $12_2$ and $12_3$ have the respective drains connected to the source of the MOSFET $13_1$.

The MOSFET $13_0$ has the gate connected to the inversion control line $BD_2$, and the drain connected to a first input terminal $IN_1$ of the comparator 50. The MOSFET $13_1$ has the gate connected to the control line $D_2$, and the drain connected to the first input terminal $IN_1$ of the comparator 50.

In the multiplexer 10 having this structure, when the clock signal CLK is at "H" level, the potential levels of the three control lines $D_0$, $D_1$, and $D_2$ are controlled so as to select a spin MOSFET from the eight spin MOSFETs $11_0$ to $11_7$. Through the selected spin MOSFET, the first input terminal $IN_1$ of the comparator 50 and the ground power supply GND can be electrically connected. For example, if the clock signal CLK is at "H" level, the MOSFET 14 is turned ON, and the sources of the eight spin MOSFETs $11_0$ to $11_7$ are at the ground potential level. If the three control lines $D_0$, $D_1$, and $D_2$ are all at the high potential level in this case, the first input terminal $IN_1$ of the comparator 50 is electrically connected to the ground power supply GND only via the path indicated by the broken line in FIG. 2, or the path that runs through the MOSFET $13_1$, the MOSFET $12_3$, and the spin MOSFET $11_7$. Accordingly, only the spin MOSFET $11_7$ is selected, and is electrically connected to the first input terminal $IN_1$ of the comparator 50 in this case.

Figure 3:
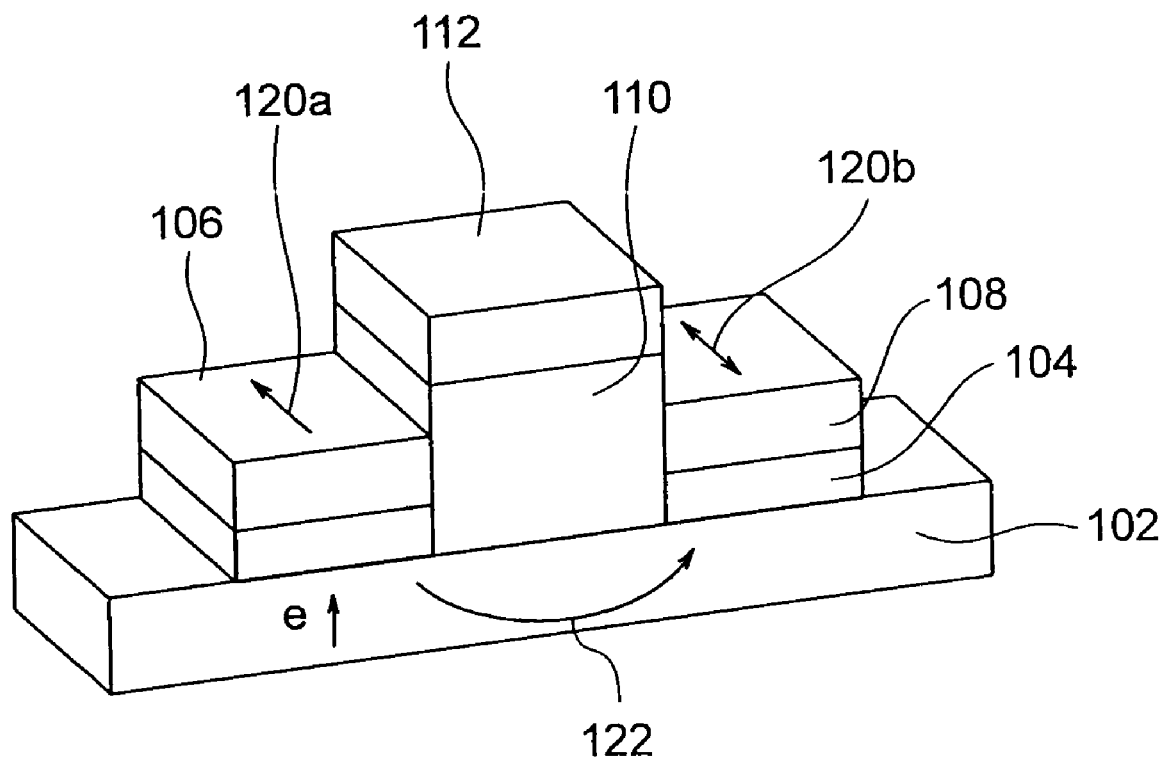
FIG. 3 is a perspective view of a conventional spin MOSFET.

FIG. 3 shows the structure of a typical spin MOSFET. In this spin MOSFET, a pair of tunnel insulating films 104 made of MgO, for example, are formed at a distance from each other on an n-type silicon substrate 102. A first magnetic film 106 that is formed with a CoFeB magnetic layer having invariable magnetization direction 120a is formed on one of the two tunnel insulating films 104. A second magnetic film 108 that is formed with a CoFeB magnetic layer (a magnetization free layer) having variable magnetization direction 120b is formed on the other one of the two tunnel insulating films 104. A gate insulating film 110 made of $SiO_2$, a high-k material (a high-dielectric material), or the like is formed on the portion of the silicon substrate 102 between the two tunnel insulating films 104. A gate electrode 112 made of CoFeB or the like is formed on the gate insulating film 110. In this spin MOSFET, one of the first magnetic film 106 and the second magnetic film 108 serves as the source, and the other one of the first magnetic film 106 and the second magnetic film 108 serves as the drain. When a gate voltage is applied to the gate electrode 112, a spin-polarized current 122 flows from the source to the drain. Accordingly, the magnetization directions of the inner magnetic members 106 and 108 are in one of the two spin states: a parallel state and an antiparallel state. The resistance values in the two states are different. In the spin MOSFET, the resistance between the source and the drain observed when a "H"-level voltage is applied to the gate 112 is represented by $R_P$ in the parallel state, and is represented by $R_{AP}$ in the antiparallel state. Where the rate of magnetoresistance change MR in the spin MOSFET is $(R_{AP}-R_P)/R_P$, this embodiment achieves MR=10000%. A memory function is provided, because the spin state is retained in the parallel state or the antiparallel state unless a write current is supplied between the source and the drain to reverse the spin state of the magnetization free layer 108. In the above description, the two spin states are the parallel state and the antiparallel state, but they are not limited to the parallel state and the antiparallel state, as long as the resistance value of the spin MOSFET is different between the two states.

Since a spin MOSFET normally has a memory function as described above, the multiplexer 10 of this embodiment includes a memory function.

To achieve a great change in the resistance of each of the spin MOSFETs $11_0$ to $11_7$ in the multiplexer 10 of this embodiment, the ratio between the gate length $L_s$ and the gate width $W_s$ ($=L_s/W_s$) of each of the spin MOSFETs $11_0$ to $11_7$ should preferably be higher than the ratio between the gate length L and the gate width W ($=L/W$) of each of the n-type MOSFETs $12_0$ to $12_3$, $13_0$, and $13_1$, so as to increase the operation margin.

Having the three control lines $D_0$, $D_1$ and $D_2$, the multiplexer 10 of this embodiment is formed as an 8-to-1 multiplexer that includes the eight (=$2^3$) spin MOSFETs, the six MOSFETs, and the three inverters. Likewise, where the number of control lines is n, a $2^n$-to-1 multiplexer can be formed with $2^n$ spin MOSFETS, ($2^n-2$) MOSFETs, and n inverters.

In the multiplexer 10 of this embodiment, the sources and drains in the above described connections among the spin MOSFETs $11_0$ to $11_7$ and the MOSFETs $12_0$ to $12_3$, $13_0$, and $13_1$ may be switched.

Referring back to FIG. 1, the current supply sources 30 and 32, the reference portion 40, the comparator 50, and the write circuit 60 are described.

The current supply source 30 supplies current to a selected spin MOSFET from the first input terminal $IN_1$ of the comparator 50. The current supply source 32 supplies current to the reference portion 40 from a second input terminal $IN_2$ of the comparator 50.

The comparator 50 compares the potential observed at the first input terminal $IN_1$ when a current is supplied to the selected spin MOSFET from the first input terminal $IN_1$ by the current supply source 30, with the potential observed at the second input terminal $IN_2$ when a current is supplied to the reference portion 40 from the second input terminal $IN_2$ by the current supply source 32. By doing so, the comparator 50 reads the resistance value of the spin MOSFET selected by the input signal of the three control lines $D_0$, $D_1$, and $D_2$, and determines the spin state of the selected spin MOSFET. If the spin state of the selected spin MOSFET is the parallel state (or the resistance value is low), the comparator 50 outputs the high voltage level "H" to the output terminal OUT of the comparator 50. If the spin state of the selected spin MOSFET is the antiparallel state (or the resistance value is high), the comparator 50 outputs the low voltage level "L".

Figure 4:
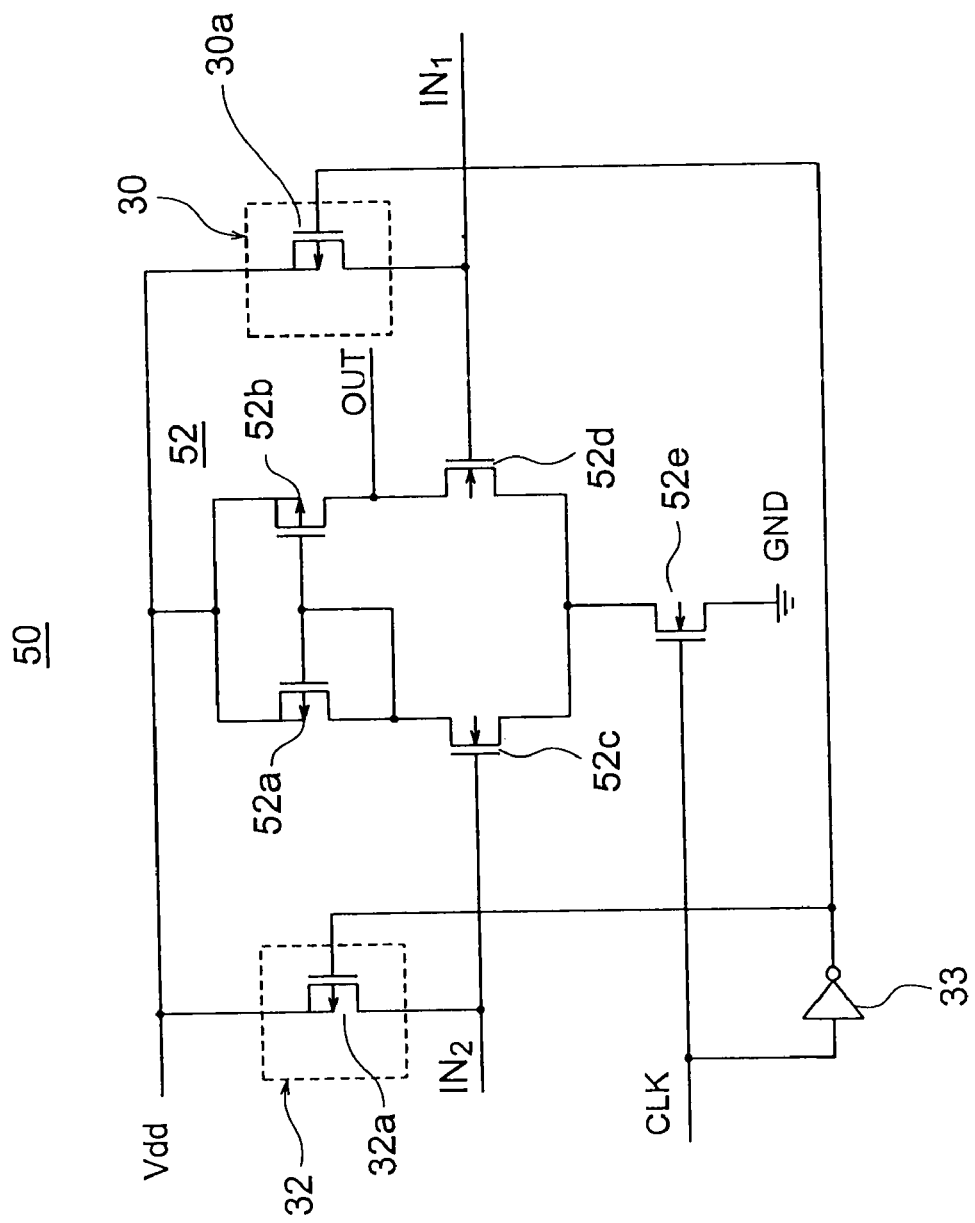
FIG. 4 is a circuit diagram showing a specific example of the comparator and the current supply sources according to the first embodiment.

FIG. 4 shows a specific example of the comparator 50 and the current supply sources 30 and 32. The comparator 50 in this example has a differential amplifier circuit 52. The differential amplifier circuit 52 includes p-type MOSFETs 52a and 52b, and n-type MOSFETs 52c, 52d, and 52e. The p-type MOSFET 52a has a source connected to a power supply voltage Vdd, and a gate and a drain connected to each other and also connected to the drain of the n-type MOSFET 52c. The p-type MOSFET 52b has a source connected to the power supply voltage Vdd, a gate connected to the gate of the p-type MOSFET 52a, and a drain connected to the drain of the n-type MOSFET 52d. The n-type MOSFET 52c has a gate connected to the second input terminal $IN_2$, and a source connected to the drain of the n-type MOSFET 52e. The n-type MOSFET 52d has a gate connected to the first input terminal $IN_1$, and a source connected to the drain of the n-type MOSFET 52e. The n-type MOSFET 52e has a gate receiving the clock signal CLK, and has a source grounded. The drain of the n-type MOSFET 52d is connected to the output terminal OUT.

In this embodiment, the current supply source 30 is formed with a p-type MOSFET 30a, and the current supply source 32 is formed with a p-type MOSFET 32a, as shown in FIG. 4. The p-type MOSFET 30a has a source connected to the power supply voltage Vdd, a drain connected to the first input terminal $IN_1$ of the comparator 50, and a gate receiving the clock signal CLK via an inverter 33. The p-type MOSFET 32a has a source connected to the power supply voltage Vdd, a drain connected to the second input terminal $IN_2$ of the comparator 50, and a gate receiving the clock signal CLK via the inverter 33.

The reference portion 40 is designed to generate a constant potential at the second input terminal $IN_2$ of the comparator 50 when the current is supplied from the current supply source 32.

The write circuit 60 includes a first write unit 61 that writes the data "1" into the spin MOSFET selected by the input signal of the three control lines $D_0$, $D_1$, and $D_2$ or switches the magnetization directions of the magnetic bodies of the source and drain of the spin MOSFET from the antiparallel state to the parallel state (or maintains the parallel state as it is), and a second write unit 62 that writes the data "0" into the spin MOSFET selected by the input signal of the three control lines $D_0$, $D_1$, and $D_2$ or switches the magnetization directions of the magnetic bodies of the source and drain of the spin MOSFET from the parallel state to the antiparallel state (or maintains the antiparallel state as it is). In a case where the data stored in the spin MOSFET is to be read out prior to writing, and the same state is to be maintained, the write circuit 60 does not need to perform writing.

The first write unit 61 includes a write current source 61a, a p-type MOSFET 61b, an n-type MOSFET 61c, and a write current drain 61d. In the first write unit 61, current flows from the write current source 61a to the write current drain 61d via the p-type MOSFET 61b, the multiplexer 10, and the n-type MOSFET 61c. The p-type MOSFET 61b has a source connected to the write current source 61a, a gate receiving the inversion signal BSW1 of a write signal SW1 for writing the data "1", and a drain connected to the sources of the spin MOSFETs $11_0$ to $11_7$. The n-type MOSFET 61c has a drain connected to the first input terminal $IN_1$ of the comparator 50, a gate receiving the write signal SW1, and a source connected to the write current drain 61d.

The second write unit 62 includes a write current source 62a, a p-type MOSFET 62b, an n-type MOSFET 62c, and a write current drain 62d. In the second write unit 62, current flows from the write current source 62a to the write current drain 62d via the p-type MOSFET 62b, the multiplexer 10, and the n-type MOSFET 62c. The p-type MOSFET 62b has a source connected to the write current source 62a, a gate receiving the inversion signal BSW0 of a write signal SW0, and a drain connected to the first input terminal $IN_1$ of the comparator 50. The n-type MOSFET 62c has a source connected to the write current drain 62d, a gate receiving the write signal SW0 for writing the data "0", and a drain connected to the sources of the spin MOSFETs $11_0$ to $11_7$. In this embodiment, when one of the first and second write units 61 and 62 is operating, the clock signal CLK is at "L" level, and the n-type MOSFET 14 shown in FIG. 1 is in an OFF state.

In this embodiment having the above arrangement, the first write unit 61 has electrons flowing from the drain of a spin MOSFET to the source of the spin MOSFET, and the second write unit 62 has electrons flowing from the source of a spin MOSFET to the drain of the spin MOSFET. Accordingly, the magnetization direction of the magnetic body of the drain of each spin MOSFET is invariable, and the magnetization direction of the magnetic body of the source is variable in this embodiment. On the other hand, In a case where to write the data "1" is to switch the magnetization directions of the magnetic bodies of the source and drain of a spin MOSFET from the parallel state to the antiparallel state, as opposed to the case of this embodiment, the magnetization direction of the magnetic body of the drain of the spin MOSFET is variable, and the magnetization direction of the magnetic body of the source is invariable.

In this embodiment having the above structure, control data is transmitted to the control lines $D_0$ to $D_2$, so as to select one of the spin MOSFETs $11_0$ to $11_7$. As the clock signal CLK switches from "L" level to "H" level in this situation, the p-type MOSFETs 30a and 30b of the current supply sources 30 and 32 are turned ON. Current then flows from the current supply source 30 to the selected spin MOSFET. At the same time, current flows from the current supply source 32 to the reference portion 40. The comparator 50 then compares the potential at the first input terminal $IN_1$ with the potential at the second input terminal $IN_2$, and determines the spin state of the selected spin MOSFET. The data corresponding to the determined spin state is output from the output terminal OUT of the comparator 50. More specifically, if the magnetization directions of the magnetic bodies of the source and drain of the selected spin MOSFET are in the parallel state (where the data stored in the spin MOSFET is "1"), the high voltage level "H" is output from the output terminal OUT. If the magnetization directions of the magnetic bodies of the source and drain of the selected spin MOSFET are in the antiparallel state (where the data stored in the spin MOSFET is "0"), the low voltage level "L" is output from the output terminal OUT.

In this embodiment, the comparator 50 determines the spin state by reading the voltage caused by the flow of current in the spin MOSFET. Instead of the comparator 50, it is possible to employ a comparator that determines the spin state by reading the current flowing as a voltage is applied to the spin MOSFET.

In this embodiment, the comparator 50 determines the spin state of the selected spin MOSFET, and outputs the voltage reflecting the spin state, when the clock signal CLK is at "H" level. However, it is possible to employ a comparator that determines the spin state only when the clock signal CLK switches from "L" level to "H" level.

Figure 5:
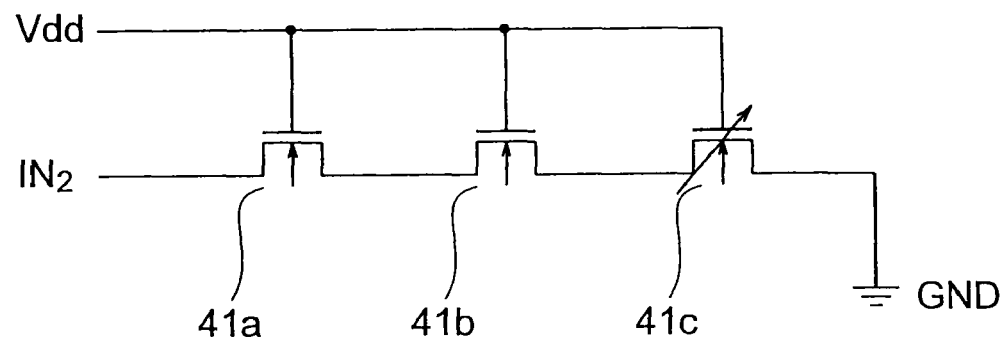
FIG. 5 is a circuit diagram showing a first specific example of the reference portion according to the first embodiment.

Next, specific examples of the reference portion 40 used in this embodiment are described. FIG. 5 shows a first specific example of the reference portion 40. The reference portion 40 of the first specific example includes an n-type MOSFET 41a, an n-type MOSFET 41b, and an n-type spin MOSFET 41c that are connected in series. The MOSFET 41a has a drain connected to the second input terminal $IN_2$ of the comparator 50, and a source connected to the drain of the MOSFET 41b, with the power supply voltage Vdd being applied to the gate. The MOSFET 41b has a source connected to the drain of the spin MOSFET 41c, with the power supply voltage Vdd being applied to the gate. The spin MOSFET 41c has a grounded source, with the power supply voltage Vdd being applied to the gate.

In the reference portion 40 of the first specific example, if the spin state of the spin MOSFET 41c is the antiparallel state, the gate width of the spin MOSFET 41c is made $\{(2+MR)/2\}$ times as great as the gate width of each of the spin MOSFETs $11_0$ to $11_7$ shown in FIG. 1, so that the resistance of the spin MOSFET 41c becomes equal to the intermediate value between the resistance value observed when the spin state of each of the spin MOSFETs $11_0$ to $11_7$ is the parallel state and the resistance value observed when the spin state of each of the spin MOSFETs $11_0$ to $11_7$ is the antiparallel state.

Here, the gate length of the spin MOSFET 41c is the same as the gate length of the spin MOSFETs $11_0$ to $11_7$, and MR represents the rate of magnetoresistance change in the spin MOSFET 41c and the spin MOSFETs $11_0$ to $11_7$. Each of the n-type MOSFETs 41a and 41b has the same ON resistance as each of the n-type MOSFETs $12_0$ to $12_3$, $13_0$, and $13_1$ of the multiplexer 10 shown in FIG. 1.

In the reference portion 40 of the first specific example, if the spin state of the spin MOSFET 41c is the parallel state, it is preferable that the spin MOSFET 41c has the same gate width as the gate width of each of the spin MOSFETs $11_0$ to $11_7$, but has a gate length $\{(2+MR)/2\}$ times as great as the gate length of each of the spin MOSFETs $11_0$ to $11_7$. With this arrangement, the resistance of the spin MOSFET 41c becomes equal to the intermediate value between the resistance value observed when the spin state of each of the spin MOSFETs $11_0$ to $11_7$ is the parallel state and the resistance value observed when the spin state of each of the spin MOSFETs $11_0$ to $11_7$ is the antiparallel state.

Figure 6:
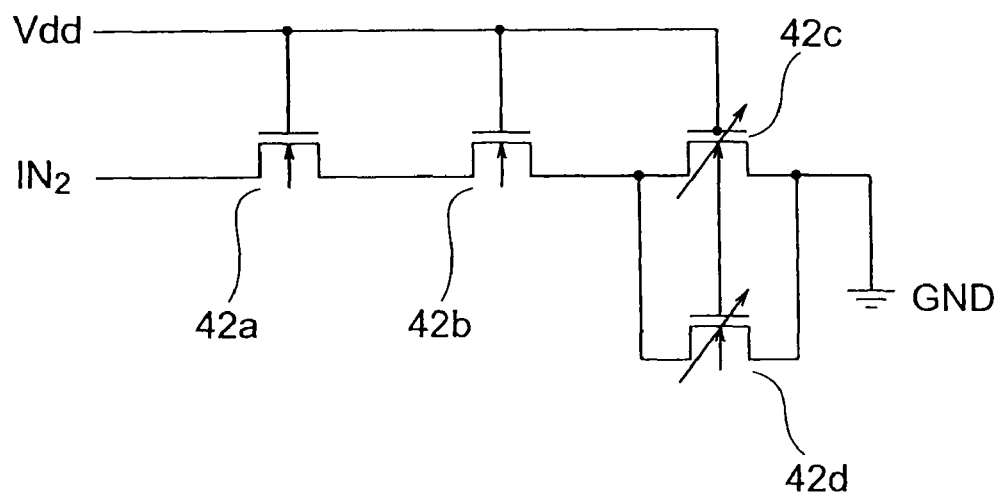
FIG. 6 is a circuit diagram showing a second specific example of the reference portion according to the first embodiment.

FIG. 6 shows a second specific example of the reference portion 40. The reference portion 40 of the second specific example includes n-type MOSFETs 42a and 42b connected in series, and n-type spin MOSFETs 42c and 42d connected in parallel. The MOSFET 42a has a drain connected to the second input terminal $IN_2$ of the comparator 50, and a source connected to the drain of the MOSFET 42b, with the power supply voltage Vdd being applied to the gate. The MOSFET 42b has a source connected to the drains of the spin MOSFETs 42c and 42d, with the power supply voltage Vdd being applied to the gate. The spin MOSFETs 42c and 42d each have a grounded source, with the power supply voltage Vdd being applied to the gate.

In the reference portion 40 of the second specific example, the spin state of the spin MOSFET 42c is the parallel state, and the spin state of the spin MOSFET 42d is the antiparallel state. The gate width of each of the spin MOSFETs 42c and 42d is made approximately half as great as the gate width of each of the spin MOSFETs $11_0$ to $11_7$ shown in FIG. 1, while the gate length of each of the spin MOSFETs 42c and 42d is the same as the gate length of each of the spin MOSFETs $11_0$ to $11_7$. In this specific example, each of the n-type MOSFETs 42a and 42b has the same ON resistance as each of the n-type MOSFETs $12_0$ to $12_3$, $13_0$, and $13_1$ of the multiplexer 10 shown in FIG. 1.

Figure 7:
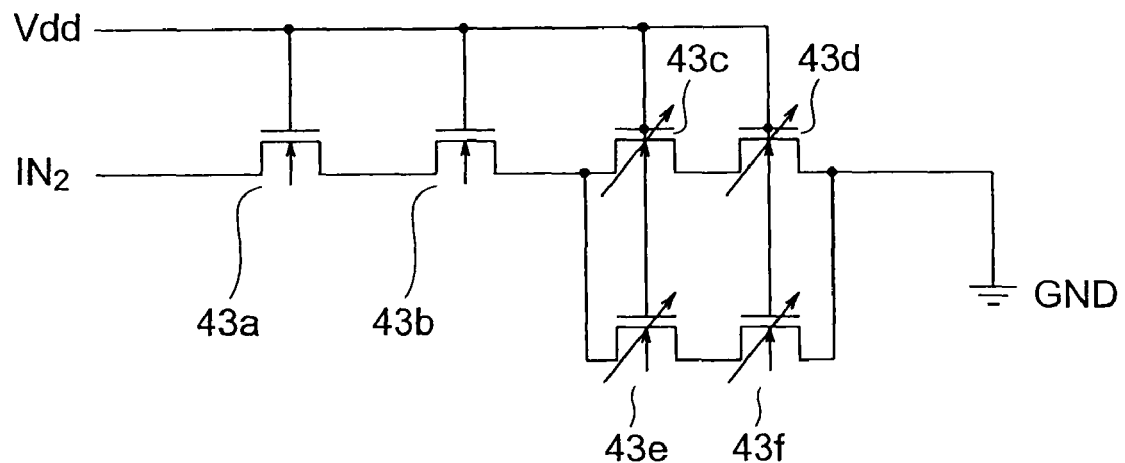
FIG. 7 is a circuit diagram showing a third specific example of the reference portion according to the first embodiment.

FIG. 7 shows a third specific example of the reference portion 40. The reference portion 40 of the third specific example includes n-type MOSFETs 43a and 43b connected in series, n-type spin MOSFETs 43c and 43d connected in series, and n-type spin MOSFETs 43e and 43f connected in series. The MOSFET 43a has a drain connected to the second input terminal $IN_2$ of the comparator 50, and a source connected to the drain of the MOSFET 43b, with the power supply voltage Vdd being applied to the gate. The MOSFET 43b has a source connected to the drains of the spin MOSFETs 43c and 43e, with the power supply voltage Vdd being applied to the gate. The spin MOSFETs 43c has a source connected to the drain of the spin MOSFET 43d, with the power supply voltage Vdd being applied to the gate. The spin MOSFET 43d has a grounded source, with the power supply voltage Vdd being applied to the gate. The spin MOSFETs 43e has a source connected to the drain of the spin MOSFET 43f, with the power supply voltage Vdd being applied to the gate. The spin MOSFET 43f has a grounded source, with the power supply voltage Vdd being applied to the gate. In this arrangement, the n-type spin MOSFETs 43c and 43d connected in series are connected in parallel to the n-type spin MOSFETs 43e and 43f connected in series.

In the reference portion 40 of the third specific example, the gate width and gate length of each of the spin MOSFETs 43c, 43d, 43e, and 43f are the same as the gate width and gate length of each of the spin MOSFETs $11_0$ to $11_7$ shown in FIG. 1. The spin state of two of the spin MOSFETs 43c, 43d, 43e, and 43f is the parallel state, and the spin state of the other two is the antiparallel state. In this specific example, each of the n-type MOSFETs 43a and 43b has the same ON resistance as each of the n-type MOSFETs $12_0$ to $12_3$, $13_0$, and $13_1$ of the multiplexer 10 shown in FIG. 1.

Figure 8:
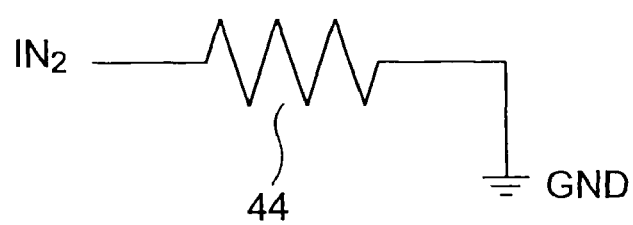
FIG. 8 is a circuit diagram showing a fourth specific example of the reference portion according to the first embodiment.

FIG. 8 shows a fourth specific example of the reference portion 40. The reference portion 40 of the fourth specific example is formed with a resistor 44 that has one end connected to the second input terminal $IN_2$ of the comparator 50, with the other end being grounded. It is preferable that the resistance value of the resistor 44 is the same as the resistance value observed where one of the two n-type MOSFETs $13_0$ and $13_1$ connected to the first input terminal $IN_1$ of the comparator 50, one of the four n-type MOSFETs $12_0$ to $12_3$, and one of the spin MOSFETs $11_0$ to $11_7$ shown in FIG. 1 are connected in series. In other words, it is preferable that the resistance value of the resistor 44 is approximately $R_{DS0}+R_{DS1}+(R_P+R_{AP})/2$, where $R_{DS0}$ represents the resistance between the source and drain of the n-type MOSFET $13_0$ having the "H" level voltage applied to its gate, $R_{DS1}$ represents the resistance between the source and drain of the n-type MOSFET $12_0$ having the "H" level voltage applied to its gate, $R_P$ represents the resistance between the source and drain observed when the spin state of the spin MOSFET is the parallel state, and $R_{AP}$ represents the resistance between the source and drain observed when the spin state of the spin MOSFET is the antiparallel state.

As described above, in accordance with this embodiment, a spin MOSFET is selected based on control data that is input to the control lines. The current supply source 30 supplies current to the selected spin MOSFET, while the current supply source 32 supplies current to the reference portion 40. The comparator 50 determines the spin state of the selected MOSFET, based on the potentials generated at the input terminals of the comparator 50. The look-up table circuit 1 then outputs the value corresponding to the spin state. In accordance with this embodiment, a reconfigurable logic circuit having the look-up table circuit 1 can be formed.

Figure 9:
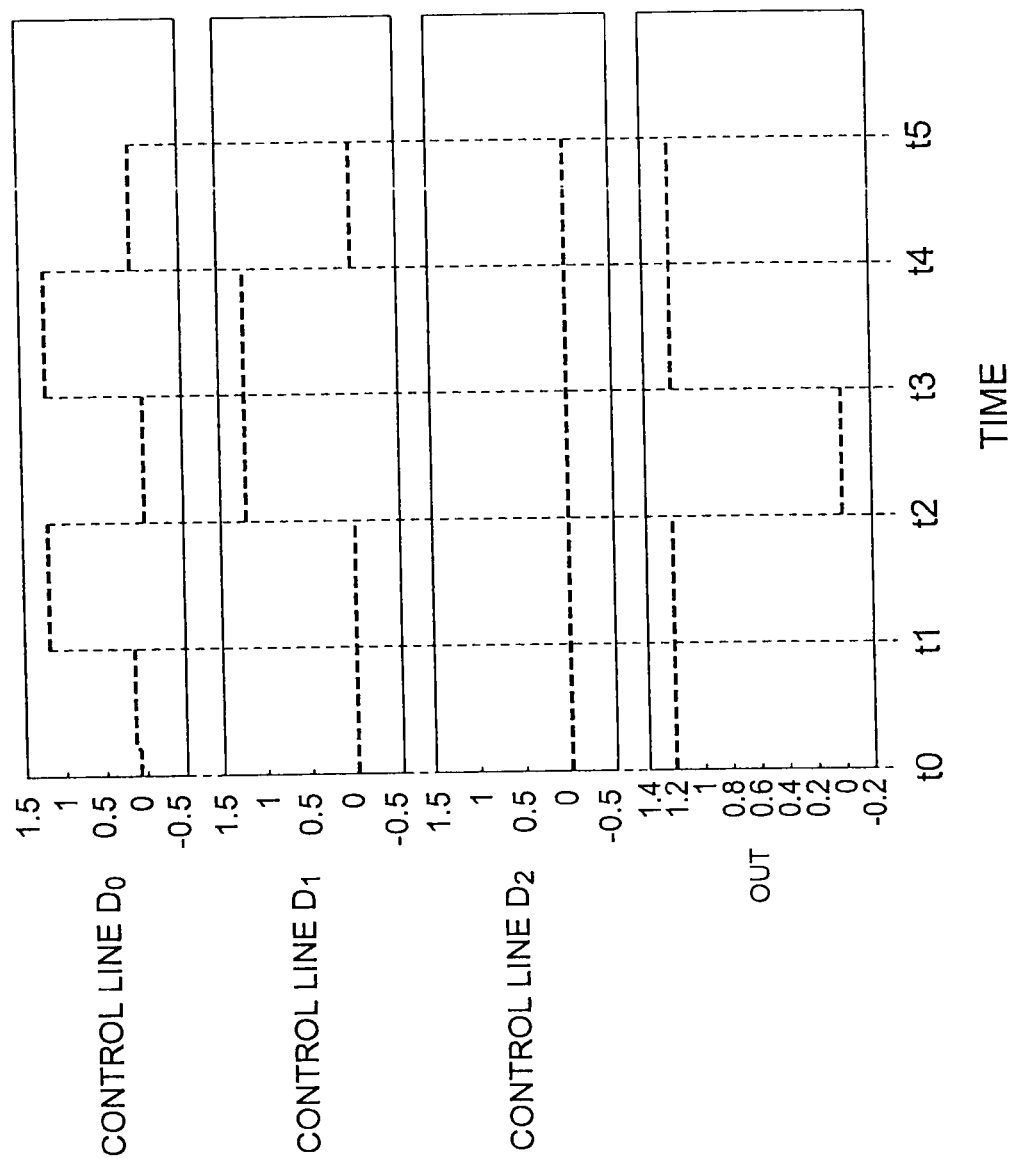
FIG. 9 is a graph showing the results of simulations performed on the logic circuit according to the first embodiment.

FIG. 9 shows the results of a simulation performed on the look-up table circuit 1 in accordance with this embodiment. In the look-up table circuit 1 during the simulation, the spin MOSFETs $11_0$, $11_1$, and $11_3$ are in the parallel state, and the spin MOSFET $11_2$ is in the antiparallel state.

In the simulation results shown in FIG. 9, all the control data that is input to the control lines $D_0$, $D_1$, and $D_2$ is "L" during the period between time t0 and time t1. Accordingly, the spin MOSFET $11_0$ is selected, and the data "H" is output from the output terminal OUT of the comparator 50.

During the period between time t1 and time t2, only the control data that is input to the control line $D_0$ is "H", and the control data that is input to the other control lines $D_1$ and $D_2$ is "L". Accordingly, the spin MOSFET $11_1$ is selected, and the data "H" is output from the output terminal OUT of the comparator 50. During the period between time t2 and time t3, only the control data that is input to the control line $D_1$ is "H", and the control data that is input to the other control lines $D_0$ and $D_2$ is "L". Accordingly, the spin MOSFET $11_2$ is selected, and the data "L" is output from the output terminal OUT of the comparator 50. During the period between time t3 and time t4, only the control data that is input to the control line $D_2$ is "L", and the control data that is input to the other control lines $D_0$ and $D_1$ is "H". Accordingly, the spin MOSFET $11_3$ is selected, and the data "H" is output from the output terminal OUT of the comparator 50. During the period between time t4 and time t5, all the control data that is input to the control lines $D_0$, $D_1$, and $D_2$ is returned to "L". Accordingly, the spin MOSFET ho is selected, and the data "H" is output from the output terminal OUT of the comparator 50.

As can be seen from the simulation results shown in FIG. 9, the look-up table circuit 1 in accordance with this embodiment operates properly. In the simulation shown in FIG. 9, the clock signal CLK shown in FIG. 4 is fixed at "H" level. However, it is more preferable to set the clock signal CLK at "L" level whenever appropriate, to reduce the power consumption.

If the total number of n-type MOSFETs and n-type spin MOSFETs is set as the number of elements, the look-up table circuit of this embodiment can have a much smaller number of elements than the number of elements in a look-up table circuit that includes n-type MOSFETs but does not include any spin MOSFETs. Thus, a reconfigurable logic circuit that can achieve higher integration or consumes lower amounts of power can be produced.

Second Embodiment

Figure 10:
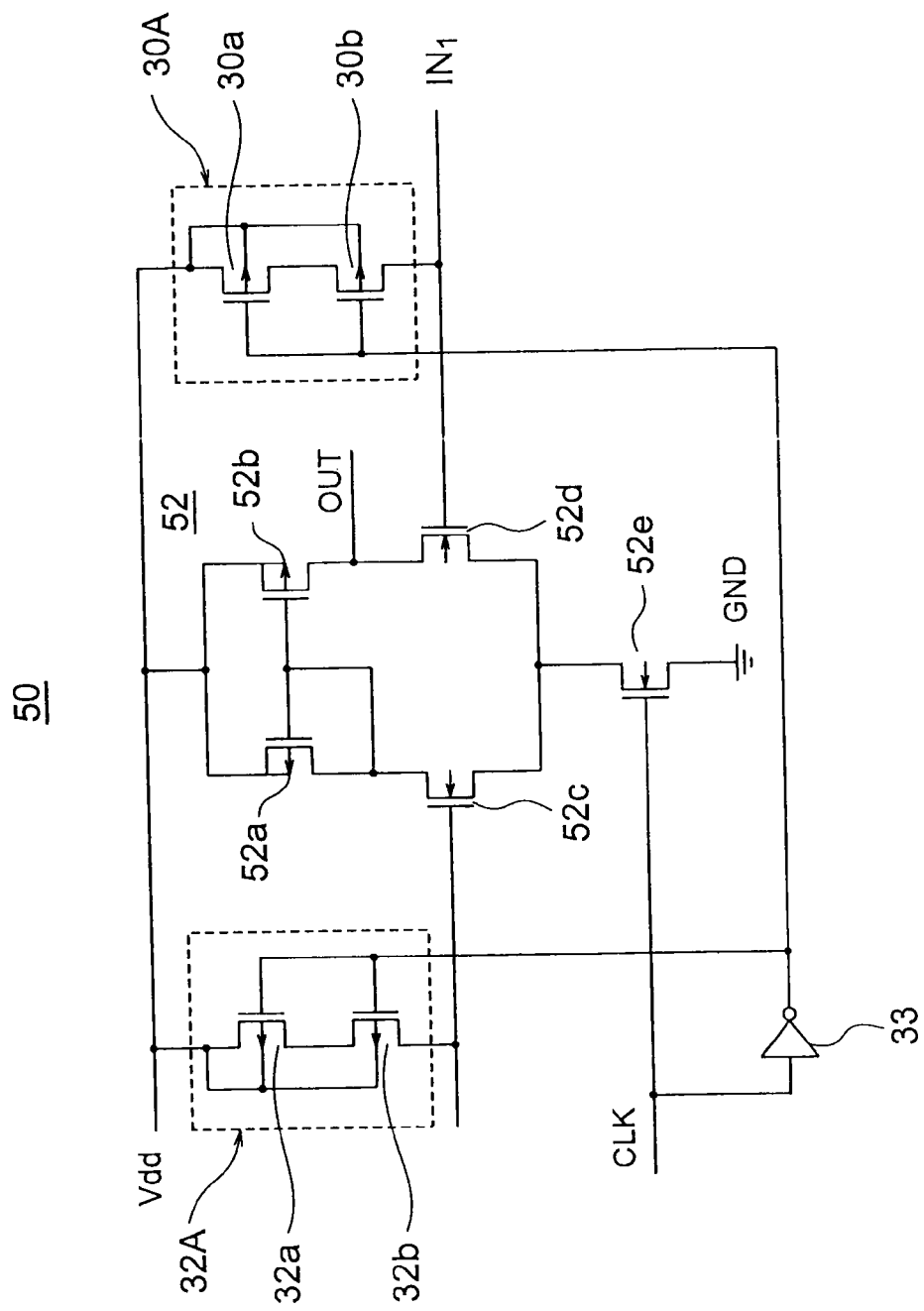
FIG. 10 is a circuit diagram showing a specific example of a comparator and current supply sources according to a second embodiment.

Referring now to FIG. 10, a reconfigurable logic circuit in accordance with a second embodiment of the present invention is described. The reconfigurable logic circuit of this embodiment is the same as the reconfigurable logic circuit of the first embodiment shown in FIG. 1, except that the current supply sources 30 and 32 are replaced with the current supply sources 30A and 32A shown in FIG. 10. The multiplexer, the reference portion, the comparator, and the write circuit of this embodiment are the same as multiplexer 10, the reference portion 40, the comparator 50, and the write circuit 60 of the reconfigurable logic circuit of the first embodiment shown in FIG. 1.

The current supply source 30A is formed with two p-type MOSFETs 30a and 30b connected in series. The p-type MOSFET 30a has a source connected to the power supply voltage Vdd and a drain connected to the source of the p-type MOSFET 30b, with an inversion signal of the clock signal CLK being input to the gate. The p-type MOSFET 30b has a drain connected to the first input terminal $IN_1$ of the comparator 50, with the inversion signal of the clock signal CLK input to the gate. With this arrangement, when the "L"-level clock is input to the gates of the p-type MOSFETs 30a and 30b, the current supply source 30A supplies current to the selected spin MOSFET from the power supply voltage Vdd via the first input terminal $IN_1$ of the comparator 50.

The current supply source 32A is formed with two p-type MOSFETs 32a and 32b connected in series. The p-type MOSFET 32a has a source connected to the power supply voltage Vdd and a drain connected to the source of the p-type MOSFET 32b, with an inversion signal of the clock signal CLK being input to the gate. The p-type MOSFET 32b has a drain connected to the second input terminal $IN_2$ of the comparator 50, with the inversion signal of the clock signal CLK input to the gate. With this arrangement, when the "L"-level clock is input to the gates of the p-type MOSFETs 32a and 32b, the current supply source 32A supplies current to the reference portion 40 from the power supply voltage Vdd via the second input terminal $IN_2$ of the comparator 50.

In this embodiment, $R_{pMOS}$ represents the resistance value from the power supply voltage Vdd to the first input terminal $IN_1$ of the comparator 50 observed when the "L"-level voltage is applied to the gates of the p-type MOSFETs 30a and 30b. Also, $R_{min}$ represents the resistance value from the first input terminal $IN_1$ to the ground power supply GND observed when the spin state of the selected spin MOSFET electrically connected to the first input terminal $IN_1$ is the parallel state, and $R_{max}$ represents the resistance value observed from the first input terminal $IN_1$ to the ground power supply GND observed when the spin state of the selected spin MOSFET electrically connected to the first input terminal $IN_1$ is the antiparallel state. The operation margin of the comparator 50 becomes the largest when $R_{pMOS}$ is approximately ($R_{min}$+ $R_{max}$)/2. In other words, the resistance value $R_{pMOS}$ is the intermediate value between the resistance value observed when the spin state is the parallel state and the resistance value observed when the spin state is the antiparallel state.

To maximize the operation margin in a case where the current supply source 30 is formed with the single p-type MOSFET 30a as in the first embodiment shown in FIG. 4, the resistance value $R_{pMOS}$ between the source and drain of the p-type MOSFET 30a is adjusted by adjusting the gate length and gate width of the p-type MOSFET 30a shown in FIG. 4. If the gate length is small, however, it is very difficult to form a p-type MOSFET having a desired resistance value, due to the short channel effect.

In this embodiment, the two p-type MOSFETs 30a and 30b are provided in series between the power supply voltage Vdd and the first input terminal $IN_1$. The characteristics differ between a case where two p-type MOSFETs are connected in series by connecting the sources and drains of the two p-type MOSFETs, and a case where the gate length of a single p-type MOSFET is doubled.

The difference between the potential observed at the first input terminal $IN_1$ when the spin state of the spin MOSFET is the parallel state, and the potential observed at the first input terminal $IN_1$ when the spin state is the antiparallel state is represented by ΔV. Compared with a case where the current supply source 30 is formed with a p-type MOSFET having a doubled gate length, with the use of a spin MOSFET having a MR of 3000%, the difference ΔV in this embodiment becomes 2.6 times larger. Accordingly, the operation margin of the comparator 50 can be increased by a large amount.

In this embodiment, two p-type MOSFETs with short gate lengths are connected in series, so as to reduce the variation of the resistance values of the p-type MOSFETs due to the influence of the manufacture process, and constantly achieve a large operation margin for the comparator. Thus, a high-yield reconfigurable logic circuit can be produced.

The following is a description of the advantages achieved in the case where the current supply source 30A includes two p-type MOSFETs. To obtain a large operation margin, it is preferable that the resistance of the p-type MOSFETs of the current supply source 30A is substantially the same as the resistance of the path extending from the first input terminal $IN_1$ to the ground power supply GND through spin MOSFETs. Although two or more n-type MOSFETs and spin MOSFETs exist on the path extending from the first input terminal $IN_1$ to the ground power supply GND through spin MOSFETs, the resistance value of a p-type MOSFET can be made equal to the resistance of the path extending from the first input terminal $IN_1$ to the ground power supply GND through spin MOSFETs, by adjusting the gate length and gate width of the p-type MOSFET of the current supply source 30A.

When the gate length is 300 nm or less, the short channel effect becomes very large, and it becomes difficult to control the resistance value of the MOSFET by adjusting the gate length and gate width. Therefore, if the gate length is 300 nm or less and allows a short channel effect to appear, it is preferable that the current supply source 30A includes two or more p-type MOSFETs, so that the resistance of the current supply source 30A becomes substantially equal to the resistance of the path extending from the first input terminal $IN_1$ to the ground power supply GND through spin MOSFETs.

Simulations were performed on cases where the gate length of a MOSFET was 300 nm or less. As a result, the relationship between the number of p-type MOSFETs in the current supply source 30A or the current supply source 32A and the potential difference between the first input terminal $IN_1$ and the second input terminal $IN_2$ was obtained as shown in the table below. As can be seen from the table, it is preferable that the current supply source 30A has two p-type MOSFETs, if the gate length is 300 nm or less.

| Number of p-type MOSFETs | Potential difference between first input terminal $IN_1$ and second input terminal $IN_2$ |
|---|---|
| 1 | 132 mV |
| 2 | 346 mV |
| 3 | 221 mV |

As described above, the reconfigurable logic circuit of the second embodiment can achieve higher integration or consumes lower amounts of power, like the reconfigurable logic circuit of the first embodiment.

Third Embodiment

Figure 11:
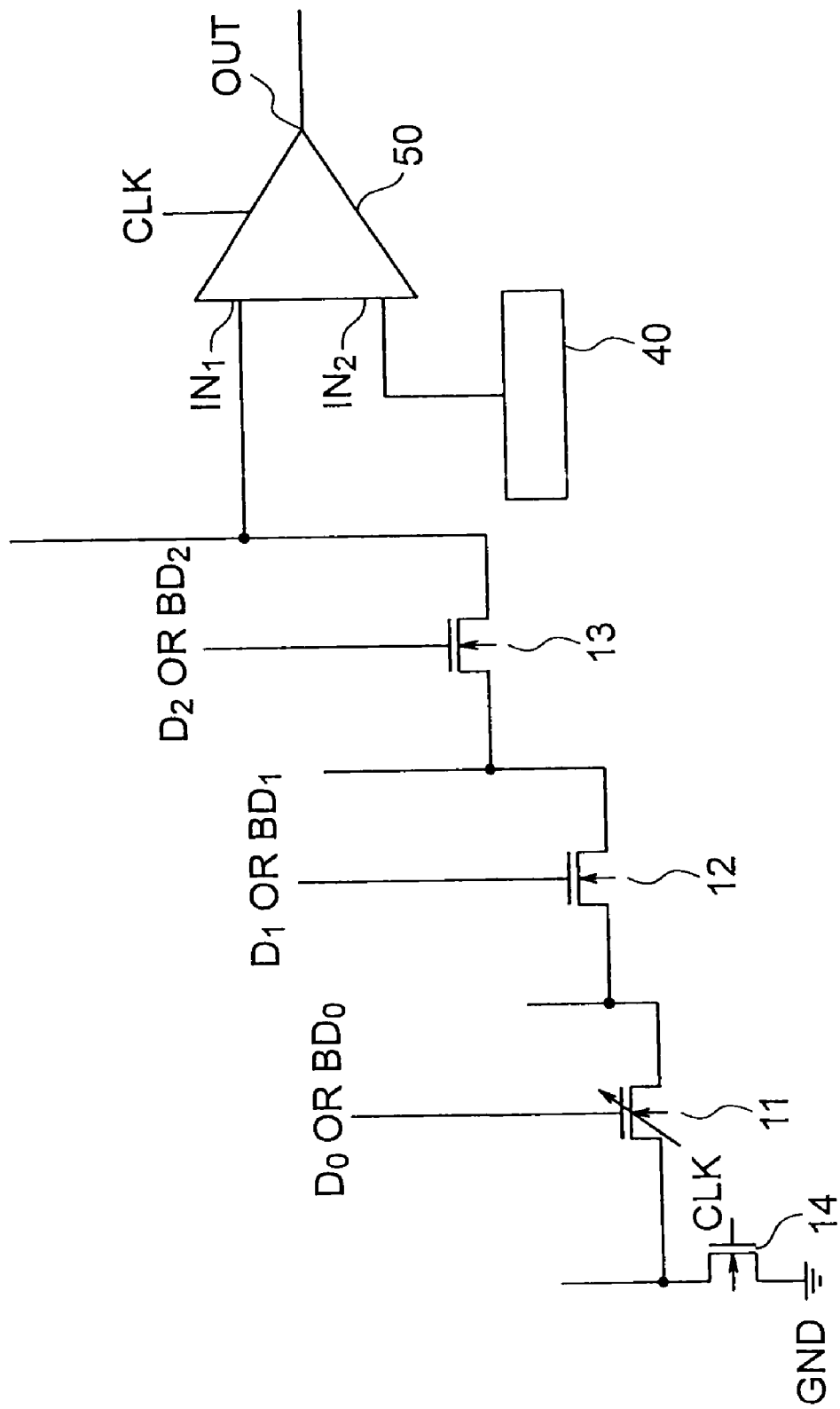
FIG. 11 illustrates a reconfigurable logic circuit according to a third embodiment.

Referring now to FIG. 11, a reconfigurable logic circuit in accordance with a third embodiment of the present invention is described.

The reconfigurable logic circuit of this embodiment is the same as the reconfigurable logic circuit of the first embodiment shown in FIG. 1, except that, in the multiplexer 10, the gate width of each of the n-type MOSFETs $12_0$ to $12_3$, $13_0$, and $13_1$ is 1.5 or more times greater than the gate width of each of the spin MOSFETs $11_0$ to $11_7$.

FIG. 11 shows only the n-type MOSFETs 13 and 12 and the spin MOSFET 11 that are electrically connected to the first input terminal $IN_1$ of the comparator 50 in the reconfigurable logic circuit in accordance with this embodiment. Between the first input terminal $IN_1$ and the ground GND, the sources and drains of the spin MOSFET 11, the n-type MOSFET 12, and the n-type MOSFET 13 are connected in series. The resistance value of the spin MOSFET 11 depends on its spin state. When the spin state is the parallel state, the resistance value of the spin MOSFET 11 is $R_P$, and, when the spin state is the antiparallel state, the resistance value is $R_{AP}$. Where $R_{total}$ represents the resistance between the first input terminal $IN_1$ and the ground GND, and $R_{nMos}$ represents the resistance of the n-type MOSFETs 12 and 13, the following equation is established: $R_{total}=2\times R_{nMos}+R_P$ or $R_{total}=2\times R_{nMos}+R_{AP}$. Since the comparator 50 determines the spin state based on the variation of the resistance value $R_{total}$, the operation margin of the comparator 50 is larger when the resistance of the n-type MOSFETs 12 and 13 is lower than the resistance of the spin MOSFET 11. Accordingly, the resistance values of the n-type MOSFET 12 and the n-type MOSFET 13 in this embodiment are made smaller by adjusting the gate width of each of the n-type MOSFETs 12 and 13 to the value that is 1.5 times greater than the gate width of the spin MOSFET 11.

The difference between the potential observed at the first input terminal $IN_1$ when the spin state of the spin MOSFET 11 is the parallel state, and the potential observed at the first input terminal $IN_1$ when the spin state is the antiparallel state is represented by $\Delta V$. Compared with an example case where a logic circuit is formed with n-type MOSFETs 12 and 13 having the same gate width as the gate width of a spin MOSFET 11 having a MR of 300%, the difference $\Delta V$ in the logic circuit of this embodiment becomes 3.0 times larger than the difference $\Delta V$ in the logic circuit of the comparative example. Accordingly, the operation margin of the comparator 50 of this embodiment can be made much larger than the operation margin in the comparative example.

As an n-type MOSFET with a large gate length is used as a part of the multiplexer in this embodiment, a large operation margin can be achieved. Thus, a high-yield reconfigurable logic circuit can be produced.

Like the first embodiment, this embodiment can achieve higher integration or cut power consumption.

Fourth Embodiment

Referring now to FIGS. 12 to 17, a reconfigurable logic circuit in accordance with a fourth embodiment of the present invention is described.

In the first to third embodiments, the multiplexer 10 in each reconfigurable logic circuit is formed with the n-type MOSFETs $12_0$ to $12_3$, $13_0$, and $13_1$, and n-type spin MOSFETs $11_0$ to $11_7$ having n-type carriers performing electric conduction.

Figure 12:
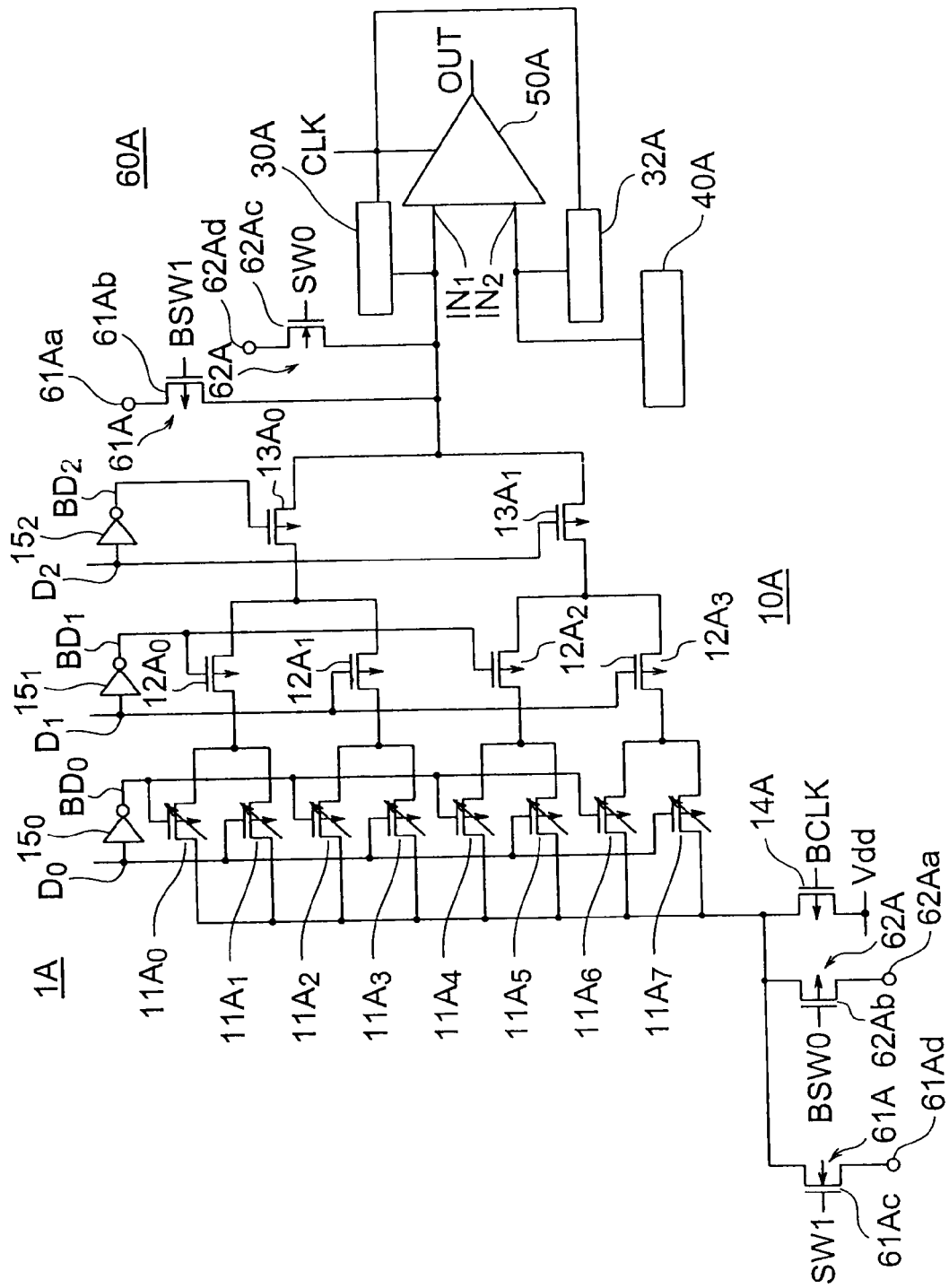
FIG. 12 is a circuit diagram of a reconfigurable logic circuit according to a fourth embodiment.

In the reconfigurable logic circuit of this embodiment, on the other hand, the multiplexer is formed with p-type MOSFETs and p-type spin MOSFETs having p-type carriers performing electric conduction. As shown in FIG. 12, the reconfigurable logic circuit in accordance with this embodiment has a look-up table circuit 1A. The look-up table circuit 1A includes a multiplexer 10A, current supply sources 30A and 32A, a reference portion 40A, a comparator 50A, and a write circuit 60A.

The multiplexer 10A is the same as the multiplexer 10 of the first embodiment shown in FIG. 1, except that the n-type spin MOSFETs $11_0$ to $11_7$ are replaced with p-type spin MOSFETs $11A_0$ to $11A_7$, and the n-type MOSFETs $12_0$ to $12_3$, $13_0$, $13_1$, and 14 are replaced with p-type MOSFETs $12A_0$ to $12A_3$, $13A_0$, $13A_1$, and 14A. The p-type MOSFET 14A has a source receiving the power supply voltage Vdd, a gate receiving the inversion signal BCLK of the clock signal CLK, and a drain connected to the sources of the spin MOSFETs $11A_0$ to $11A_7$.

Like the multiplexer 10 of the first embodiment shown in FIG. 1, the multiplexer 10A of this embodiment controls the potential levels of the three control lines $D_0$, $D_1$, and $D_2$ when the clock signal CLK is at "H" level. By doing so, one of the eight spin MOSFETs $11A_0$ to $11A_7$ is selected, and the first input terminal $IN_1$ of the comparator 50A is electrically connected to the ground power supply GND via the selected spin MOSFET.

As in the first to third embodiments, the sources and drains in the respective connections among the spin MOSFETs $11A_0$ to $11A_7$, the p-type MOSFETs $12A_0$ to $12A_3$, $13A_0$, and $13A_1$ may be switched.

Since each spin MOSFET has a memory function, the multiplexer 10A of this embodiment also includes a memory function, as in the first to third embodiments.

The differences between the multiplexer of this embodiment and the multiplexer of each of the first to third embodiments are the following two aspects:

(1) Since n-type MOSFETs and n-type spin MOSFETs are employed in the first to third embodiments, the n-type MOSFETs and the n-type spin MOSFETs are put into a conduction state when a "H" level voltage is applied to the gates of the n-type MOSFETs and the n-type spin MOSFETs. On the other hand, p-type MOSFETs and p-type spin MOSFETs are employed in this embodiment. Accordingly, when a "L" level voltage is applied to the gates of the p-type MOSFETs and the p-type spin MOSFETs, the p-type MOSFETs and the p-type spin MOSFETs are put into a conduction state in this embodiment.

(2) Since the ground GND is connected to the sources of spin MOSFETs in the first to third embodiments, current flows from the first input terminal $IN_1$ of the comparator 50 to the ground GND. In this embodiment, on the other hand, the power supply voltage Vdd is connected to the sources of the spin MOSFETs. Accordingly, current flows from the power supply voltage Vdd to the first input terminal $IN_1$.

Except for the above different aspects, the multiplexer of this embodiment has the same functions as one of the multiplexers of the first to third embodiments.

The current supply source 30A supplies a negative current (electronic current) to a selected spin MOSFET from the first input terminal $IN_1$ of the comparator 50A. The current supply source 32A supplies a negative current to the reference portion 40A from the second input terminal $IN_2$ of the comparator 50A.

The comparator 50A compares the potential observed at the first input terminal $IN_1$ when a negative current is supplied to the selected spin MOSFET from the first input terminal $IN_1$ by the current supply source 30A, with the potential observed at the second input terminal $IN_2$ when a negative current is supplied to the reference portion 40A from the second input terminal $IN_2$ by the current supply source 32A. By doing so, the comparator 50A reads the resistance value of the spin MOSFET selected by the input signal of the three control lines $D_0$, $D_1$, and $D_2$, and determines the spin state of the selected spin MOSFET. If the spin state of the selected spin MOSFET is the parallel state (or the resistance value is low), the comparator 50A outputs the high voltage level "H" to the output terminal OUT of the comparator 50A. If the spin state of the selected spin MOSFET is the antiparallel state (or the resistance value is high), the comparator 50A outputs the low voltage level "L".

Figure 13:
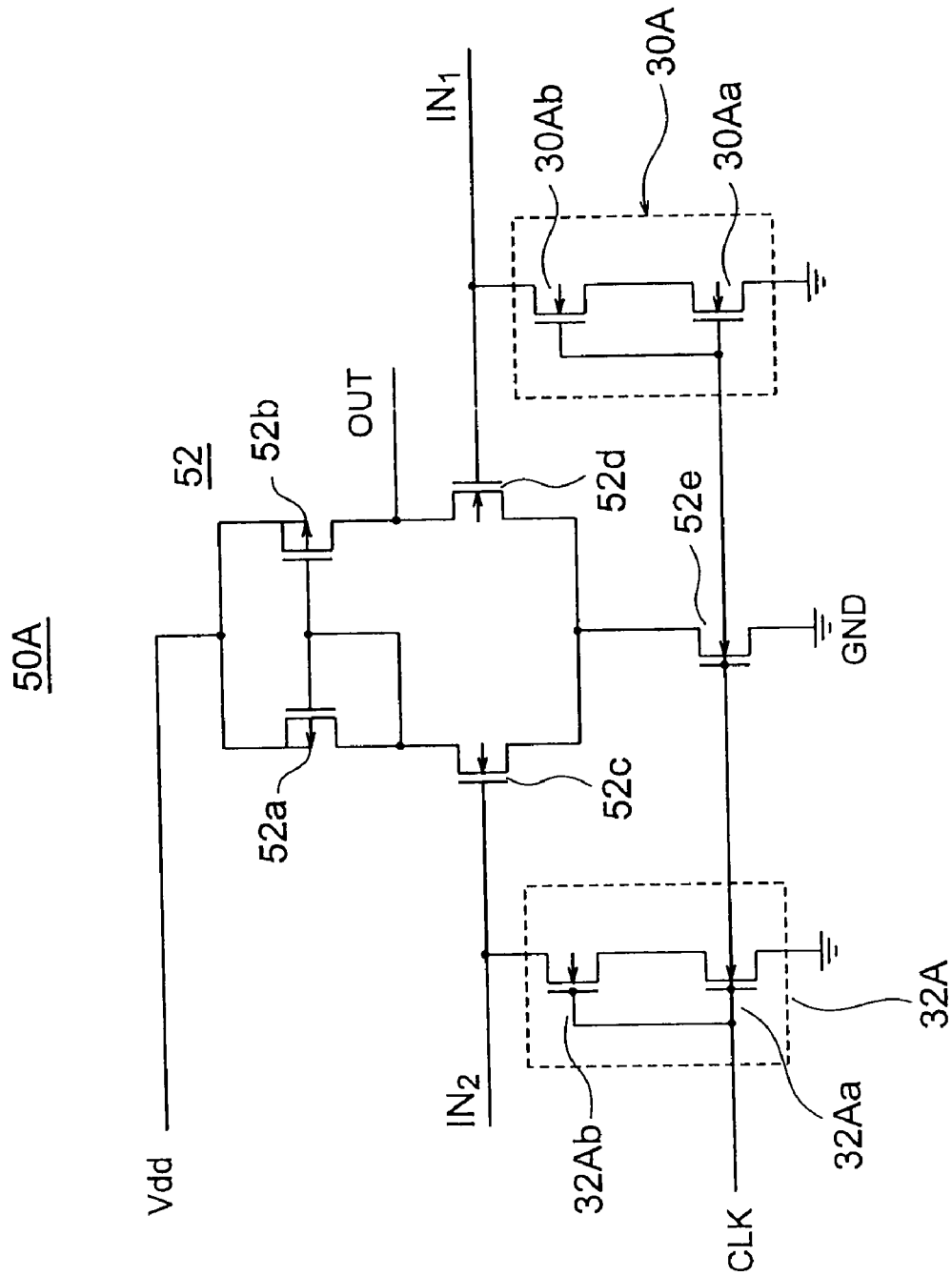
FIG. 13 is a circuit diagram showing a specific example of the comparator and the current supply sources according to the fourth embodiment.

FIG. 13 shows a specific example of the comparator 50A and the current supply sources 30A and 32A. The comparator 50A in this example has the same structure as the comparator 50 of the first embodiment, and includes the same differential amplifier circuit 52 as the differential amplifier circuit 52 shown in FIG. 4. The differential amplifier circuit 52 includes p-type MOSFETs 52a and 52b, and n-type MOSFETs 52c, 52d, and 52e. The p-type MOSFET 52a has a source connected to the power supply voltage Vdd, and a gate and a drain connected to each other and also connected to the drain of the n-type MOSFET 52c. The p-type MOSFET 52b has a source connected to the power supply voltage Vdd, a gate connected to the gate of the p-type MOSFET 52a, and a drain connected to the drain of the n-type MOSFET 52d. The n-type MOSFET 52c has a gate connected to the second input terminal $IN_2$, and a source connected to the drain of the n-type MOSFET 52e. The n-type MOSFET 52d has a gate connected to the first input terminal $IN_1$, and a source connected to the drain of the n-type MOSFET 52e. The n-type MOSFET 52e has a gate receiving the clock signal CLK, and has a source grounded. The drain of the n-type MOSFET 52d is connected to the output terminal OUT.

In this embodiment, the current supply source 30A is formed with two n-type MOSFETs 30Aa and 30Ab that have small gate lengths and are connected in series as shown in FIG. 13. The current supply source 32A is formed with two n-type MOSFETs 32Aa and 32Ab that have small gate lengths and are connected in series, as shown in FIG. 13. The n-type MOSFET 30Aa has a source connected to the ground GND, a drain connected to the source of the n-type MOSFET 32Ab, and a gate receiving the clock signal CLK. The n-type MOSFET 30Ab has a drain connected to the first input terminal $IN_1$ of the comparator 50A, and a gate receiving the clock signal CLK. The n-type MOSFET 32Aa has a source connected to the ground GND, a drain connected to the source of the n-type MOSFET 32Ab, and a gate receiving the clock signal CLK. The n-type MOSFET 32Ab has a drain connected to the second input terminal $IN_2$ of the comparator 50A, and a gate receiving the clock signal CLK.

As in the second embodiment, two n-type MOSFETs with small gate lengths are connected in series, so as to restrict the variation of the resistance value of each n-type MOSFETs due to the influence of the manufacture process, and constantly achieve a large operation margin for the comparator. Thus, a high-yield reconfigurable logic circuit can be produced. In this embodiment, each of the current supply sources 30A and 32A is formed with two n-type MOSFETs connected in series, but each of the current supply sources 30A and 32A may be formed with one n-type MOSFET.

Next, the write circuit 60A in accordance with this embodiment is described.

The write circuit 60A includes a first write unit 61A that writes the data "1" into the spin MOSFET selected by the input signal of the three control lines $D_0$, $D_1$, and $D_2$ or switches the magnetization directions of the magnetic bodies of the source and drain of the spin MOSFET to the parallel state, and a second write unit 62A that writes the data "0" into the spin MOSFET selected by the input signal of the three control lines $D_0$, $D_1$, and $D_2$ or switches the magnetization directions of the magnetic bodies of the source and drain of the spin MOSFET to the antiparallel state.

The first write unit 61A includes a write current source 61Aa, a p-type MOSFET 61Ab, an n-type MOSFET 61Ac, and a write current drain 61Ad. In the first write unit 61A, current flows from the write current source 61Aa to the write current drain 61Ad via the p-type MOSFET 61Ab, the multiplexer 10A, and the n-type MOSFET 61Ac. The p-type MOSFET 61Ab has a source connected to the write current source 61Aa, a gate receiving the inversion signal BSW1 of a write signal SW1 for writing the data "1", and a drain connected to the first input terminal $IN_1$ of the comparator 50A. The n-type MOSFET 61Ac has a drain connected to the sources of the spin MOSFETs $11A_0$ to $11A_7$, a gate receiving the write signal SW1, and a source connected to the write current drain 61Ad.

The second write unit 62A includes a write current source 62Aa, a p-type MOSFET 62Ab, an n-type MOSFET 62Ac, and a write current drain 62Ad. In the second write unit 62A, current flows from the write current source 62Aa to the write current drain 62Ad via the p-type MOSFET 62Ab, the multiplexer 10A, and the n-type MOSFET 62Ac. The p-type MOSFET 62Ab has a source connected to the write current source 62Aa, a gate receiving a write signal BSW0 formed by inverting a write signal SW0, and a drain connected to the sources of the spin MOSFETs $11A_0$ to $11A_7$. The n-type MOSFET 62Ac has a source connected to the write current drain 62Ad, a gate receiving the write signal SW0 for writing the data "0", and a drain connected to the first input terminal $IN_1$ of the comparator 50A. In this embodiment, when one of the first and second write units 61A and 62A is operating, the clock signal CLK is at "H" level, and the p-type MOSFET 14A shown in FIG. 12 is in an OFF state.

In this embodiment having the above structure, control data is transmitted to the control lines $D_0$ to $D_2$, so as to select one of the spin MOSFETs $11A_0$ to $11A_7$. As the clock signal CLK switches from "L" level to "H" level in this situation, the p-type MOSFETs 30Aa and 30Ab of the current supply sources 30A and 32A are turned ON. A negative current then flows from the current supply source 30A to the selected spin MOSFET. At the same time, a negative current flows from the current supply source 32A to the reference portion 40A. The comparator 50A then compares the potential at the first input terminal $IN_1$ with the potential at the second input terminal $IN_2$, and determines the spin state of the selected spin MOSFET. The data corresponding to the determined spin state is output from the output terminal OUT of the comparator 50A. More specifically, if the magnetization directions of the magnetic bodies of the source and drain of the selected spin MOSFET are in the parallel state (where the data stored in the spin MOSFET is "1"), the high voltage level "H" is output from the output terminal OUT. If the magnetization directions of the magnetic bodies of the source and drain of the selected spin MOSFET are in the antiparallel state (where the data stored in the spin MOSFET is "0"), the low voltage level "L" is output from the output terminal OUT.

In this embodiment, the comparator 50A determines the spin state by reading the voltage caused by the flow of current in the spin MOSFET. Instead of the comparator 50A, it is possible to employ a comparator that determines the spin state by reading the current flowing as a voltage is applied to the spin MOSFET.

In this embodiment, the comparator 50A determines the spin state of the selected spin MOSFET, and outputs the voltage reflecting the spin state, when the clock signal CLK is at "H" level. However, it is possible to employ a comparator that determines the spin state only when the clock signal CLK switches from "L" level to "H" level.

Figure 14:
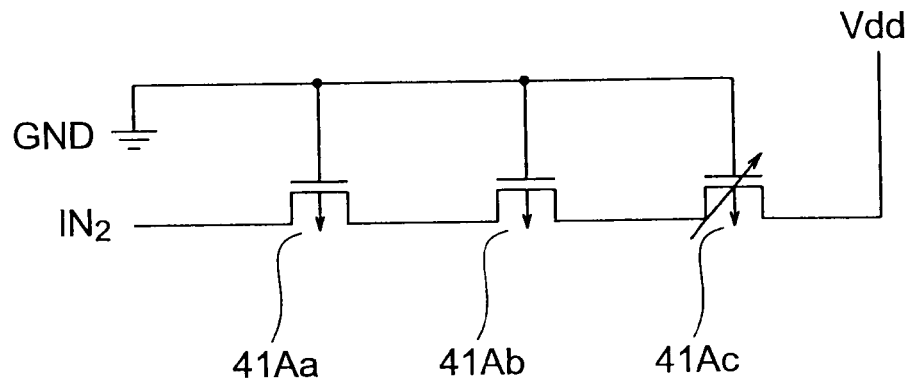
FIG. 14 is a circuit diagram showing a first specific example of the reference portion according to the fourth embodiment.

Next, specific examples of the reference portion 40A used in this embodiment are described. FIG. 14 shows a first specific example of the reference portion 40A. The reference portion 40A of the first specific example includes a p-type MOSFET 41Aa, a p-type MOSFET 41Ab, and a p-type spin MOSFET 41Ac that are connected in series. The MOSFET 41Aa has a drain connected to the second input terminal $IN_2$ of the comparator 50A, a source connected to the drain of the MOSFET 41Ab, and a gate connected to the ground GND. The MOSFET 41Ab has a source connected to the drain of the spin MOSFET 41Ac, and a gate connected to the ground GND. The spin MOSFET 41Ac has a gate connected to the ground GND, with the power supply voltage Vdd being applied to the source.

In the reference portion 40A of the first specific example, if the spin state of the spin MOSFET 41Ac is the antiparallel state, the gate width of the spin MOSFET 41Ac is made $\{(2+MR)/2\}$ times as great as the gate width of each of the spin MOSFETs $11A_0$ to $11A_7$ shown in FIG. 12, so that the resistance of the spin MOSFET 41Ac becomes equal to the intermediate value between the resistance value observed when the spin state of each of the spin MOSFETs $11A_0$ to $11A_7$ is the parallel state and the resistance value observed when the spin state of each of the spin MOSFETs $11A_0$ to $11A_7$ is the antiparallel state. Here, the gate length of the spin MOSFET 41Ac is the same as the gate length of the spin MOSFETs $11A_0$ to $11A_7$, and MR represents the rate of magnetoresistance change in the spin MOSFET 41Ac and the spin MOSFETs $11A_0$ to $11A_7$. Each of the p-type MOSFETs 41Aa and 41Ab has the same ON resistance as each of the p-type MOSFETs $12A_0$ to $12A_3$, $13A_0$, and $13A_1$ of the multiplexer 10A shown in FIG. 12.

In the reference portion 40A of the first specific example, if the spin state of the spin MOSFET 41Ac is the parallel state, it is preferable that the spin MOSFET 41Ac has the same gate width as the gate width of each of the spin MOSFETs $11A_0$ to $11A_7$, but has a gate length $\{2/(2+MR)\}$ times as great as the gate length of each of the spin MOSFETs $11A_0$ to $11A_7$. With this arrangement, the resistance of the spin MOSFET 41Ac becomes equal to the intermediate value between the resistance value observed when the spin state of each of the spin MOSFETs $11A_0$ to $11A_7$ is the parallel state and the resistance value observed when the spin state of each of the spin MOSFETs $11A_0$ to $11A_7$ is the antiparallel state.

Figure 15:
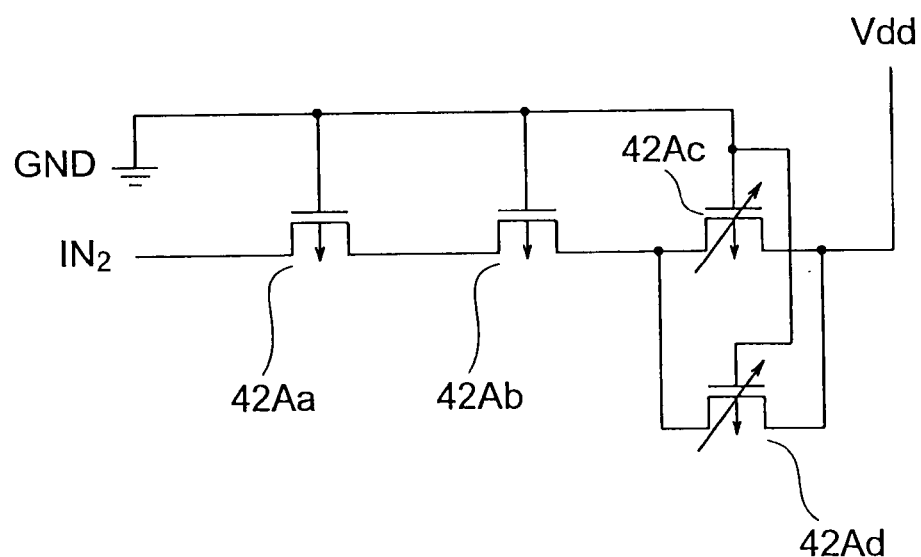
FIG. 15 is a circuit diagram showing a second specific example of the reference portion according to the fourth embodiment.

FIG. 15 shows a second specific example of the reference portion 40A. The reference portion 40A of the second specific example includes p-type MOSFETs 42Aa and 42Ab connected in series, and p-type spin MOSFETs 42Ac and 42Ad connected in parallel. The MOSFET 42Aa has a drain connected to the second input terminal $IN_2$ of the comparator 50A, a source connected to the drain of the MOSFET 42Ab, and a gate connected to the ground GND. The MOSFET 42Ab has a source connected to the drains of the spin MOSFETs 42Ac and 42Ad, with a gate connected to the ground GND. The spin MOSFETs 42Ac and 42Ad each have a gate connected to the ground GND, with the power supply voltage Vdd being applied to the source.

In the reference portion 40A of the second specific example, the spin state of the spin MOSFET 42Ac is the parallel state, and the spin state of the spin MOSFET 42Ad is the antiparallel state. The gate width of each of the spin MOSFETs 42Ac and 42Ad is made approximately twice as great as the gate width of each of the spin MOSFETs $11A_0$ to $11A_7$ shown in FIG. 12, while the gate length of each of the spin MOSFETs 42Ac and 42Ad is the same as the gate length of each of the spin MOSFETs $11A_0$ to $11A_7$. In this specific example, each of the p-type MOSFETs 42Aa and 42Ab has the same ON resistance as each of the p-type MOSFETs $12A_0$ to $12A_3$, $13A_0$, and $13A_1$ of the multiplexer 10A shown in FIG. 12.

Figures 16, 17:
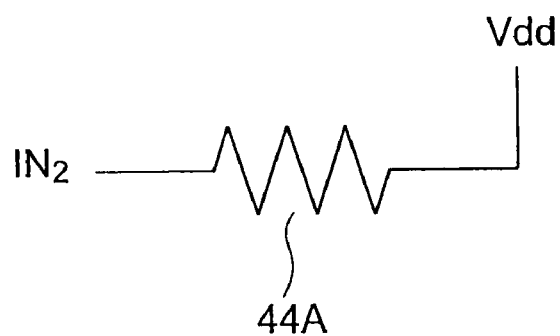
FIG. 16 is a circuit diagram showing a third specific example of the reference portion according to the fourth embodiment.
FIG. 17 is a circuit diagram showing a fourth specific example of the reference portion according to the fourth embodiment.

FIG. 16 shows a third specific example of the reference portion 40A. The reference portion 40A of the third specific example includes p-type MOSFETs 43Aa and 43Ab connected in series, p-type spin MOSFETs 43Ac and 43Ad connected in series, and p-type spin MOSFETs 43Ae and 43af connected in series. The MOSFET 43Aa has a drain connected to the second input terminal $IN_2$ of the comparator 50A, a source connected to the drain of the MOSFET 43Ab, and a gate connected to the ground GND. The MOSFET 43Ab has a source connected to the drains of the spin MOSFETs 43Ac and 43Ae, and a gate connected to the ground GND. The spin MOSFETs 43Ac has a gate connected to the ground GND, and a source connected to the drain of the spin MOSFET 43Ad. The spin MOSFET 43Ad has a gate connected to the ground GND, with the power supply voltage Vdd being applied to the source. The spin MOSFETs 43Ae has a gate connected to the ground GND, and a source connected to the drain of the spin MOSFET 43Af. The spin MOSFET 43Af has a gate connected to the ground GND, with the power supply voltage Vdd being applied to the source. In this arrangement, the p-type spin MOSFETs 43Ac and 43Ad connected in series are connected in parallel to the p-type spin MOSFETs 43Ae and 43Af connected in series.

In the reference portion 40A of the third specific example, the gate width and gate length of each of the spin MOSFETs 43Ac, 43Ad, 43Ae, and 43Af are the same as the gate width and gate length of each of the spin MOSFETs $11A_0$ to $11A_7$ shown in FIG. 12. The spin state of two of the spin MOSFETs 43Ac, 43Ad, 43Ae, and 43Af is the parallel state, and the spin state of the other two is the antiparallel state. In this specific example, each of the p-type MOSFETs 43Aa and 43Ab has the same ON resistance as each of the p-type MOSFETs $12A_0$ to $12A_3$, $13A_0$, and $13A_1$ of the multiplexer 10A shown in FIG. 12.

FIG. 17 shows a fourth specific example of the reference portion 40A. The reference portion 40A of the fourth specific example is formed with a resistor 44A that has one end connected to the second input terminal $IN_2$ of the comparator 50A, with the power supply voltage being applied to the other end. It is preferable that the resistance value of the resistor 44A is the same as the resistance value observed where one of the two p-type MOSFETs $13A_0$ and $13A_1$ connected to the first input terminal $IN_1$ of the comparator 50A and one of the spin MOSFETs $11A_0$ to $11A_7$ shown in FIG. 12 are connected in series. In other words, it is preferable that the resistance value of the resistor 44A is approximately $2 \times R_{DS} + (R_P + R_{AP})/2$, where $R_{DS}$ represents the resistance between the source and drain of the p-type MOSFET having the "L" level voltage applied to its gate, $R_P$ represents the resistance between the source and drain observed when the spin state of the spin MOSFET is the parallel state, and $R_{AP}$ represents the resistance between the source and drain observed when the spin state of the spin MOSFET is the antiparallel state.

As described above, in accordance with this embodiment, a spin MOSFET is selected based on control data that is input to the control lines. The current supply source 30A supplies a negative current to the selected spin MOSFET, while the current supply source 32A supplies a negative current to the reference portion 40A. The comparator 50A determines the spin state of the selected MOSFET, based on the potentials generated at the input terminals of the comparator 50A. The look-up table circuit 1A then outputs the value corresponding to the spin state. In accordance with this embodiment, a reconfigurable logic circuit having the look-up table circuit 1A can be formed.

As described above, like the first embodiment, this embodiment can greatly reduce the number of elements in the look-up table circuit of this embodiment, compared with the number of elements in a look-up table circuit that is formed only with MOSs. Thus, a reconfigurable logic circuit that can achieve higher integration or consumes lower amounts of power can be produced.

Fifth Embodiment

Figure 18:
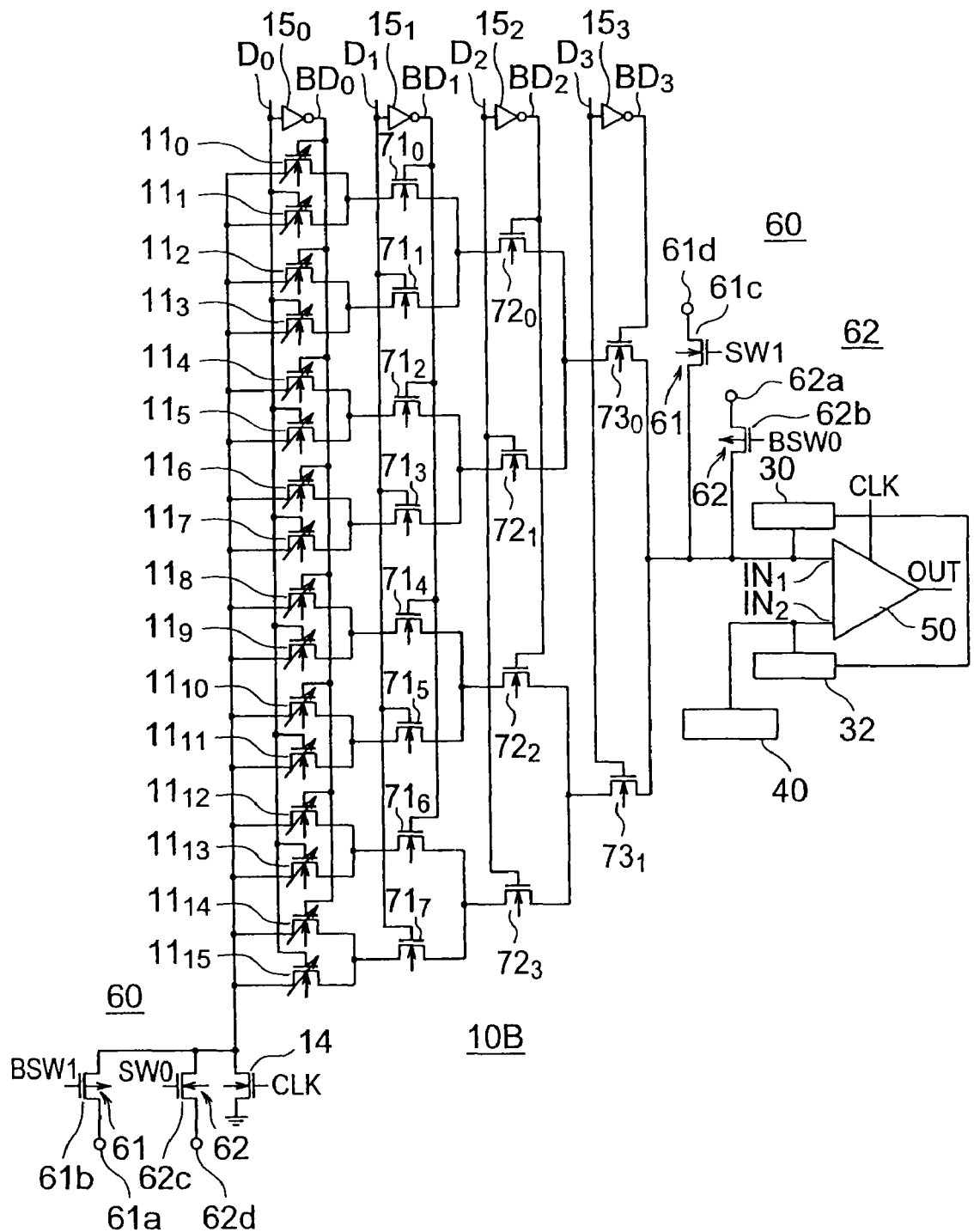
FIG. 18 is a circuit diagram of a reconfigurable logic circuit according to a fifth embodiment.

FIG. 18 shows a reconfigurable logic circuit in accordance with a fifth embodiment of the present invention. The reconfigurable logic circuit of the first embodiment illustrated in FIG. 1 is a 3-to-1 reconfigurable logic circuit, having the three control lines. On the other hand, the reconfigurable logic circuit of this embodiment is a 4-to-1 reconfigurable logic circuit, and has the same structure as the reconfigurable logic circuit of the first embodiment illustrated in FIG. 1, except that the multiplexer 10 is replaced with a multiplexer 10B.

The multiplexer 10B is a 16-to-1 multiplexer that includes four control lines $D_0$, $D_1$, $D_2$, and $D_3$, sixteen n-type spin MOSFETs $11_0$ to $11_{15}$, eight n-type MOSFETs $71_0$ to $71_7$, four n-type MOSFETs $72_0$ to $72_3$, two n-type MOSFETs $73_0$ and $73_1$, an n-type MOSFET 14, four inverters $15_0$, $15_1$, $15_2$, and $15_3$, and four inversion control lines $BD_0$, $BD_1$, $BD_2$, and $BD_3$.

Each inverter $15_i$ (i=0, 1, 2 or 3) has an input terminal connected to a control line $D_i$, and an output terminal connected to an inversion control line $BD_i$. Accordingly, a control signal flowing through an inversion control line $BD_i$ is the inversion control signal of the control signal flowing through the control line $D_i$.

The sixteen spin MOSFETs $11_0$ to $11_{15}$ have the respective sources connected to a ground power supply GND via the MOSFET 14. A clock signal CLK is input to the gate of the MOSFET 14. The eight spin MOSFETs $11_0$, $11_2$, $11_4$, $11_6$, $11_8$, $11_{10}$, $11_{12}$, and $11_{14}$ have the respective gates connected to the inversion control line $BD_0$, and the eight spin MOSFETs $11_1$, $11_3$, $11_5$, $11_7$, $11_9$, $11_{11}$, $11_{13}$, and $11_{15}$ have the respective gates connected to the control line $D_0$.

The two spin MOSFETs $11_0$ and $11_1$ have the respective drains connected to the source of the MOSFET $71_0$, the two spin MOSFETs $11_2$ and $11_3$ have the respective drains connected to the source of the MOSFET $71_1$, the two spin MOSFETs $11_4$ and $11_5$ have the respective drains connected to the source of the MOSFET $71_2$, the two spin MOSFETs $11_6$ and $11_7$ have the respective drains connected to the source of the MOSFET $71_3$, the two spin MOSFETs $11_8$ and $11_9$ have the respective drains connected to the source of the MOSFET $71_4$, the two spin MOSFETs $11_{10}$ and $11_{11}$ have the respective drains connected to the source of the MOSFET $71_5$, the two spin MOSFETs $11_{12}$ and $11_{13}$ have the respective drains connected to the source of the MOSFET $71_6$, and the two spin MOSFETs $11_{14}$ and $11_{15}$ have the respective drains connected to the source of the MOSFET $71_7$.

The four MOSFETs $71_0$, $71_2$, $71_4$, and $71_6$ have the respective gates connected to the inversion control line $BD_1$, and the four MOSFETs $71_1$, $71_3$, $71_5$, and $71_7$ have the respective gates connected to the control line $D_1$. The two MOSFETs $71_0$ and $71_1$ have the respective drains connected to the source of the MOSFET $72_0$, the two MOSFETs $71_2$ and $71_3$ have the respective drains connected to the source of the MOSFET $72_1$, the two MOSFETs $71_4$ and $71_5$ have the respective drains connected to the source of the MOSFET $72_2$, and the two MOSFETs $71_6$ and $71_7$ have the respective drains connected to the source of the MOSFET $72_3$.

The two MOSFETs $72_0$ and $72_2$ have the respective gates connected to the inversion control line $BD_2$, and the two MOSFETs $72_1$ and $72_3$ have the respective gates connected to the control line $BD_2$. The two MOSFETs $72_0$ and $72_1$ have the respective drains connected to the source of the MOSFET $73_0$, and the two MOSFETs $72_2$ and $72_3$ have the respective drains connected to the source of the MOSFET $73_1$.

The MOSFET $73_0$ has a gate connected to the inversion control line $BD_3$, and a drain connected to the first input terminal $IN_1$ of the comparator 50. The MOSFET $73_1$ has a gate connected to the control line $D_3$, and a drain connected to the first input terminal $IN_1$ of the comparator 50.

In the multiplexer 10B of this embodiment, when the clock signal CLK is at "H" level, the potential levels of the four control lines $D_0$, $D_1$, $D_2$, and $D_3$ are controlled so as to select a spin MOSFET from the sixteen spin MOSFETs $11_0$ to $11_{15}$. Through the selected spin MOSFET, the first input terminal $IN_1$ of the comparator 50 and the ground power supply GND can be electrically connected, as in the multiplexer 10 of the first embodiment illustrated in FIG. 1.

As in the first to fourth embodiments, the sources and drains in the respective connections among the spin MOSFETs $11_0$ to $11_{15}$, the n-type MOSFETs $71_0$ to $71_7$, $72_0$ to $72_3$, $73_0$, and $73_1$ may be switched.

Since each spin MOSFET has a memory function, the multiplexer 10B of this embodiment also includes a memory function, as in the first to fourth embodiments.

Figure 19:
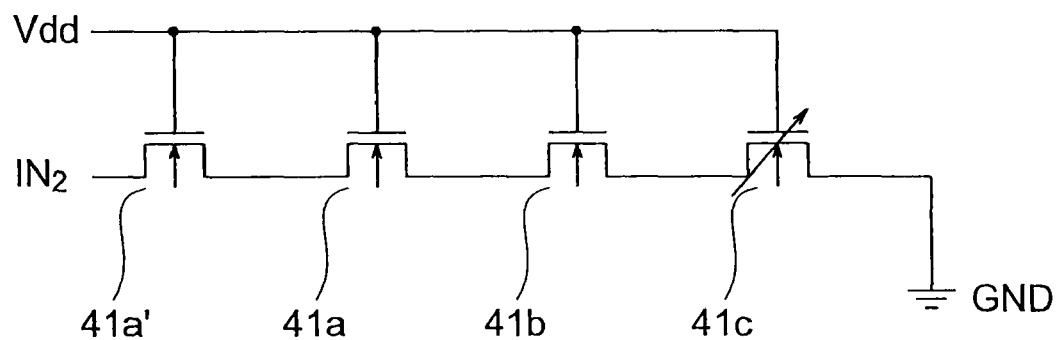
FIG. 19 is a circuit diagram showing a first specific example of the reference portion according to the fifth embodiment.
Figure 20:
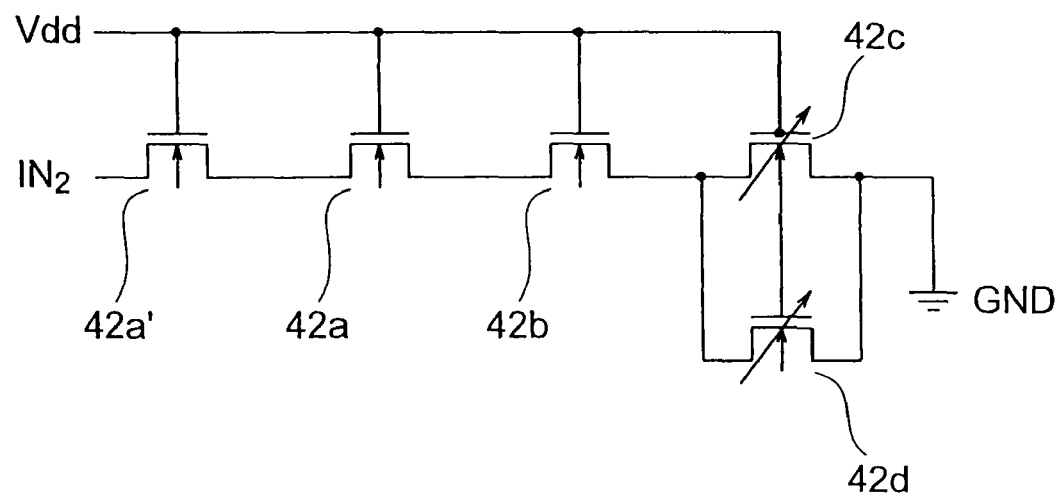
FIG. 20 is a circuit diagram showing a second specific example of the reference portion according to the fifth embodiment.
Figure 21:
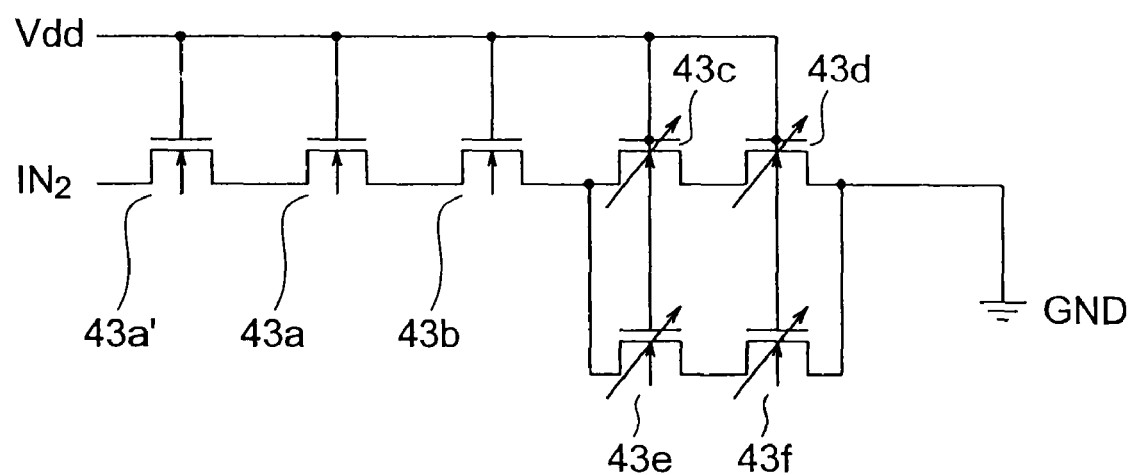
FIG. 21 is a circuit diagram showing a third specific example of the reference portion according to the fifth embodiment.

Unlike the reference portion 40 of the first embodiment illustrated in any of FIGS. 5 to 7, the reference portion 40 of this embodiment has three n-type MOSFETs connected in series. This is because the n-type MOSFETs $71_0$ to $71_7$, $72_0$ to $72_3$, $73_0$, and $73_1$ of the multiplexer 10B are connected in three stages. FIGS. 19 to 21 show first to third specific examples of the reference portion 40 of this embodiment. The reference portion 40 of the first specific example shown in FIG. 19 is the same as the reference portion 40 shown in FIG. 5, except that an n-type MOSFET 41a' is provided between the input terminal $IN_2$ and the n-type MOSFET 41a. The reference portion 40 of the second specific example shown in FIG. 20 is the same as the reference portion 40 shown in FIG. 6, except that an n-type MOSFET 42a' is provided between the input terminal $IN_2$ and the n-type MOSFET 42a. The reference portion 40 of the third specific example shown in FIG. 21 is the same as the reference portion 40 shown in FIG. 7, except that an n-type MOSFET 43a' is provided between the input terminal $IN_2$ and the n-type MOSFET 43a. The reference portion formed with the resistor shown in FIG. 8 can also be employed in this embodiment.

As described above, like the first embodiment, this embodiment can greatly reduce the number of elements in the look-up table circuit of this embodiment, compared with the number of elements in a look-up table circuit that is formed only with MOSs. Thus, a reconfigurable logic circuit that can achieve higher integration or consumes lower amounts of power can be produced.

Sixth Embodiment

Figure 22:
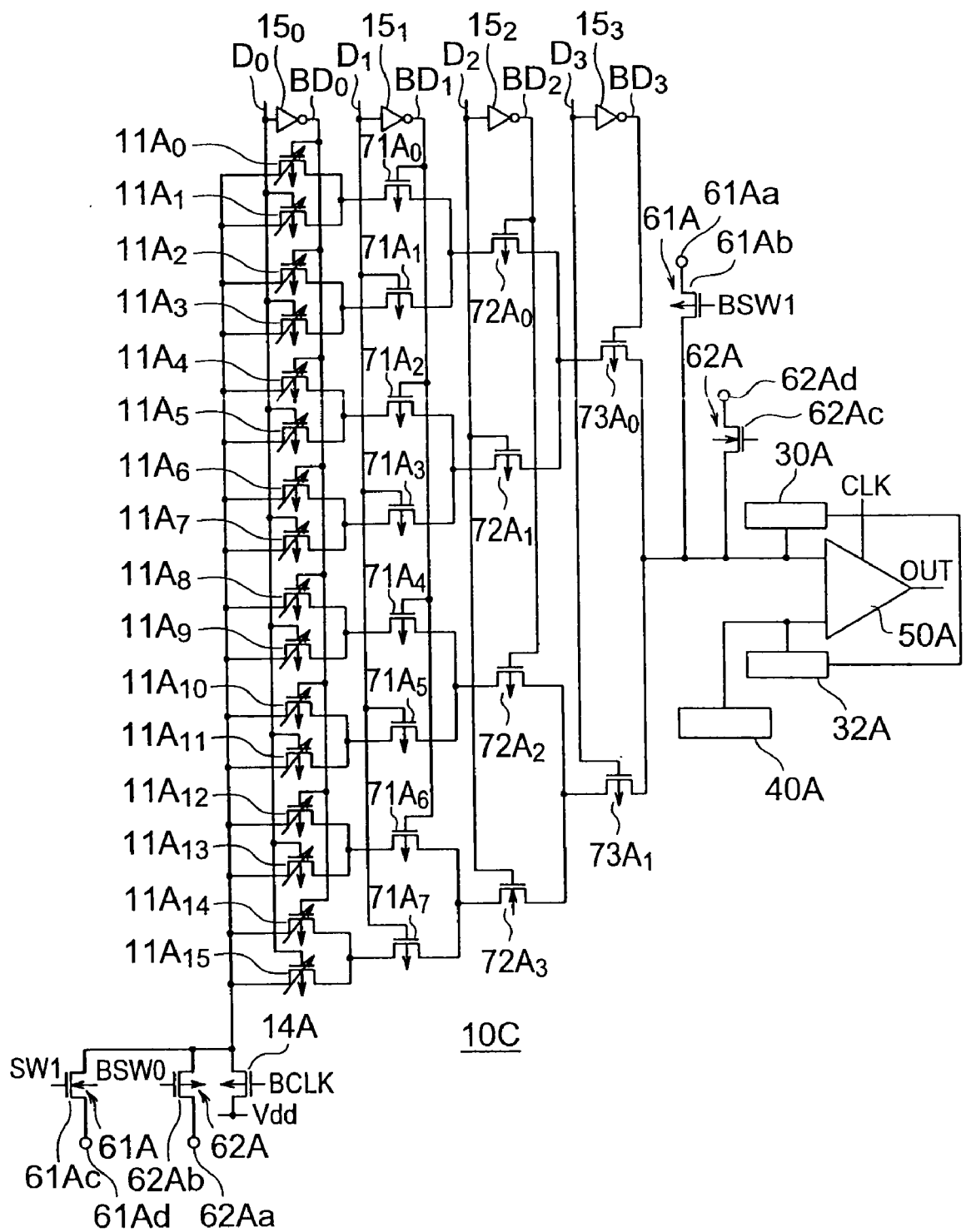
FIG. 22 is a circuit diagram of a reconfigurable logic circuit according to a sixth embodiment.

FIG. 22 shows a reconfigurable logic circuit in accordance with a sixth embodiment of the present invention. The reconfigurable logic circuit of this embodiment is a 4-to-1 reconfigurable logic circuit, and has the same structure as the reconfigurable logic circuit of the fourth embodiment illustrated in FIG. 12, except that the multiplexer 10A is replaced with a multiplexer 10C.

The multiplexer 10C has the same structure as the multiplexer 10A of the fifth embodiment illustrated in FIG. 18, except that the n-type spin MOSFETs $11_0$ to $11_{15}$ are replaced with p-type spin MOSFETs $11A_0$ to $11A_{15}$ and the n-type MOSFETs $71_0$ to $71_7$, $72_0$ to $72_3$, $73_0$ and $73_1$, and 14 are replaced with p-type MOSFETs $71A_0$ to $71A_7$, $72A_0$ to $72A_3$, $73A_0$ and $73A_1$, and 14A. The p-type MOSFET 14A has a source receiving the power supply voltage Vdd, a gate receiving the inversion signal BCLK of the clock signal CLK, and a drain connected to the sources of the spin MOSFETs $11A_0$ to $11A_{15}$.

In the multiplexer 10C of this embodiment, when the clock signal CLK is at "H" level, the potential levels of the four control lines $D_0$, $D_1$, $D_2$, and $D_3$ are controlled so as to select a spin MOSFET from the sixteen spin MOSFETs $11A_0$ to $11A_{15}$. Through the selected spin MOSFET, the first input terminal $IN_1$ of the comparator 50A and the ground power supply GND can be electrically connected, as in the multiplexer 10B of the fifth embodiment illustrated in FIG. 18.

As in the first to fifth embodiments, the sources and drains in the respective connections among the spin MOSFETs $11A_0$ to $11A_{15}$, the p-type MOSFETs $71A_0$ to $71A_7$, $72A_0$ to $72A_3$, $73A_0$, and $73A_1$ may be switched.

Since each spin MOSFET has a memory function, the multiplexer 10C of this embodiment also includes a memory function, as in the first to fifth embodiments.

Figure 23:
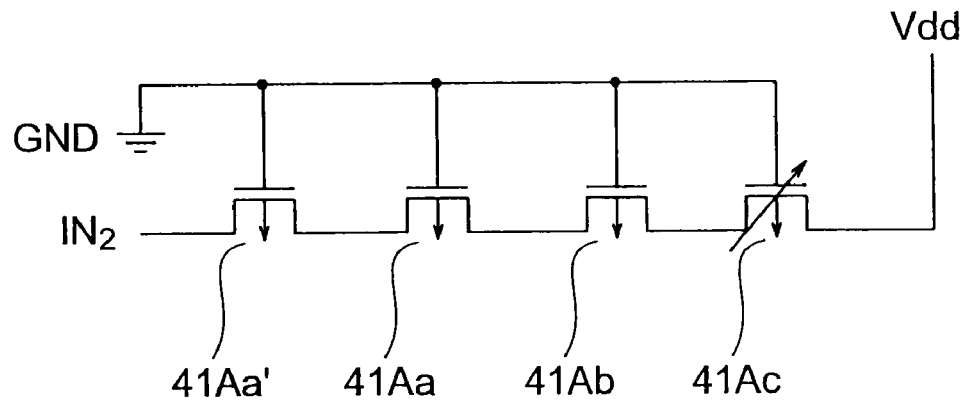
FIG. 23 is a circuit diagram showing a first specific example of the reference portion according to the sixth embodiment.
Figure 24:
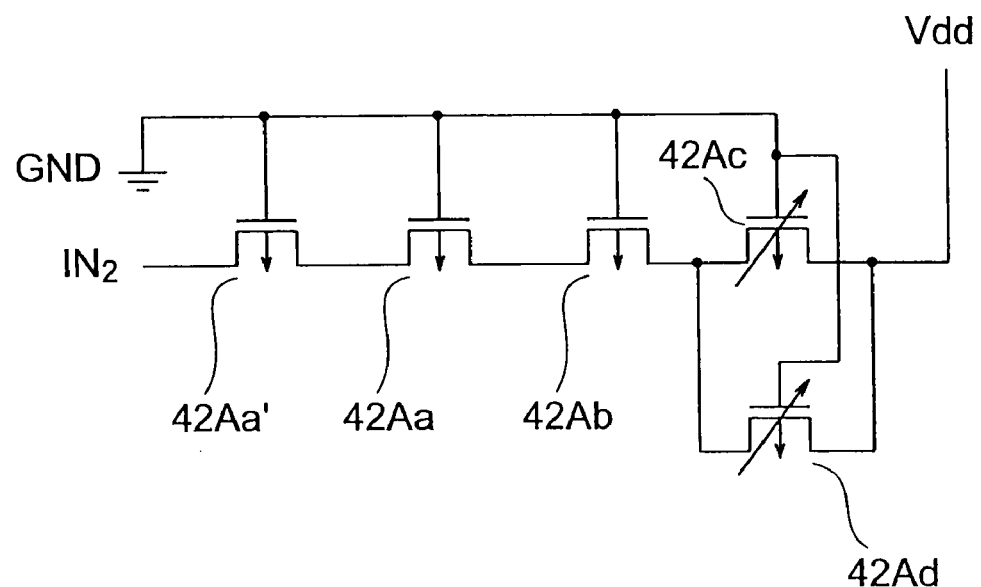
FIG. 24 is a circuit diagram showing a second specific example of the reference portion according to the sixth embodiment.
Figure 25:
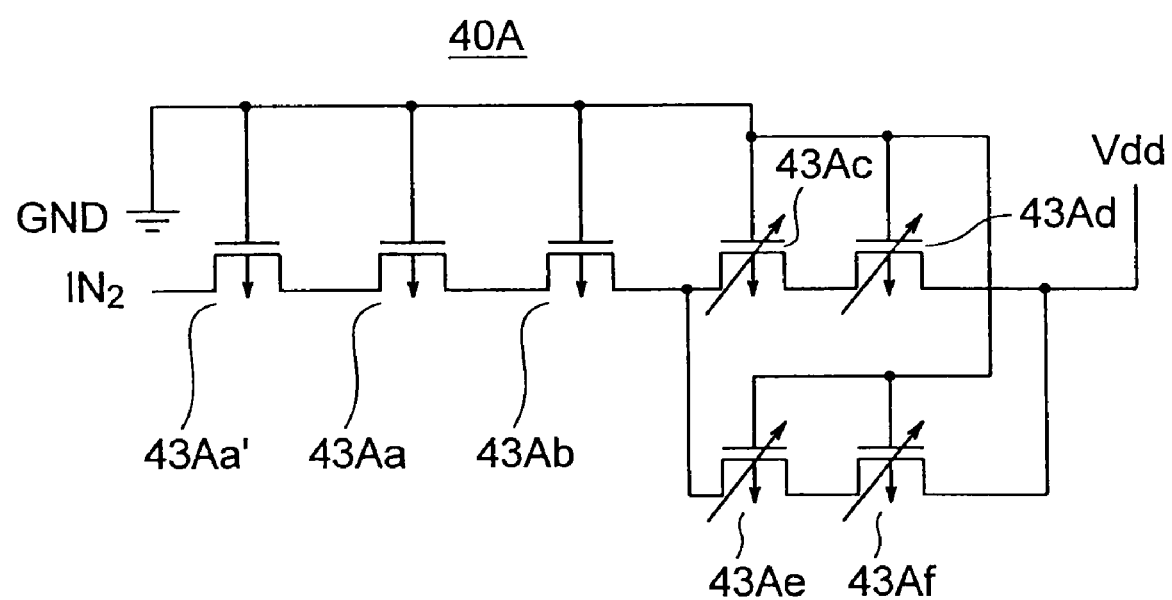
FIG. 25 is a circuit diagram showing a third specific example of the reference portion according to the sixth embodiment.

Unlike the reference portion 40A of the fourth embodiment illustrated in any of FIGS. 14 to 16, the reference portion 40A of this embodiment has three p-type MOSFETs connected in series. This is because the p-type MOSFETs $71A_0$ to $71A_7$, $72A_0$ to $72A_3$, $73A_0$, and $73A_1$ of the multiplexer 10C are connected in three stages. FIGS. 23 to 25 show first to third specific examples of the reference portion 40A of this embodiment. The reference portion 40A of the first specific example shown in FIG. 23 is the same as the reference portion 40A shown in FIG. 14, except that a p-type MOSFET 41Aa' is provided between the input terminal $IN_2$ and the p-type MOSFET 41Aa. The reference portion 40A of the second specific example shown in FIG. 24 is the same as the reference portion 40A shown in FIG. 15, except that a p-type MOSFET 42Aa' is provided between the input terminal $IN_2$ and the p-type MOSFET 42Aa. The reference portion 40A of the third specific example shown in FIG. 25 is the same as the reference portion 40A shown in FIG. 16, except that a p-type MOSFET 43Aa' is provided between the input terminal $IN_2$ and the p-type MOSFET 43Aa. The reference portion formed with the resistor shown in FIG. 17 can also be employed in this embodiment.

As described above, like the first embodiment, this embodiment can greatly reduce the number of elements in the look-up table circuit of this embodiment, compared with the number of elements in a look-up table circuit that is formed only with MOSs. Thus, a reconfigurable logic circuit that can achieve higher integration or consumes lower amounts of power can be produced.

In accordance with each of the embodiments of the present invention, spin MOSFETs each having a nonvolatile magnetic memory are employed. Accordingly, the spin state observed immediately before the power is turned off can be maintained, and a circuit operation can be started immediately after the power is turned on. Thus, the waiting time normally required immediately after the power is turned on can be eliminated, and the power consumption can be reduced by switching off the power supply during the stand-by period in which the circuit operation is stopped.

Also, with the look-up table circuit of any of the embodiments of the present invention being employed in each reconfigurable circuit, highly integrated circuits can be produced, and complicated logic operations can be easily performed.

Each of FIGS. 1, 2, 12, 18, and 22 shows a layout for connection of transistors. Therefore, a real layout for manufacturing of a reconfigurable circuit is not limited to one of the layouts shown in FIGS. 1, 2, 12, 18, and 22.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A reconfigurable logic circuit comprising:
   a plurality of control lines which are able to transmit control data individually;
   a multiplexer which includes a plurality of spin MOSFETs each having a source and drain containing a magnetic material, and a selecting portion including a plurality of MOSFETs and selecting a spin MOSFET from the plurality of spin MOSFETs, based on the control data transmitted from the control lines;
   a determining circuit which determines whether magnetization of the magnetic material of the source and drain of a selected spin MOSFET, which is selected by the selecting portion, is in a first state or in a second state different from the first state, the determining circuit outputting a determination result;
   a first write circuit which puts the magnetization of the magnetic material of the source and drain of the selected spin MOSFET into the second state by supplying a write current flowing between the source and drain of the selected spin MOSFET; and
   a second write circuit which puts the magnetization of the magnetic material of the source and drain of the selected spin MOSFET into the first state by supplying a write current flowing between the source and drain of the selected spin MOSFET.

2. The circuit according to claim 1, further comprising:
   a reference portion which generates a reference potential when a current is supplied;
   a first current supply source which supplies a current to the selected spin MOSFET, based on a clock signal; and
   a second current supply source which supplies a current to the reference portion, based on the clock signal,
   wherein the determining circuit includes a differential amplifier circuit that has a first input terminal connected to the first current supply source and a second input terminal connected to the second current supply source, and amplifies and outputs a difference between a first potential and a second potential, the first potential being generated at the first input terminal when the first current supply source supplies the current to the selected spin MOSFET, the second potential being the reference potential and being generated at the second input terminal when the second current supply source supplies the current to the reference portion.

3. The circuit according to claim 1, wherein
the number of the control lines is m (3 or greater);
the number of the spin MOSFETs is $2^m$; and
the selecting portion includes $2^m-2$ MOSFETs.

4. The circuit according to claim 2, wherein:
the spin MOSFETs are n-type spin MOSFETs; and
the MOSFETs in the selecting portion are n-type MOSFETs.

5. The circuit according to claim 4, wherein:
the plurality of control lines are first to fourth control lines; the plurality of spin MOSFETs are n-type first to sixteenth spin MOSFETs; and the selecting portion includes n-type first to fourteenth MOSFETs;
the first to sixteenth spin MOSFETs have sources connected to one another; the second, fourth, sixth, eighth, tenth, twelfth, fourteenth, and sixteenth spin MOSFETs have gates receiving first control data transmitted from the first control line; and the first, third, fifth, seventh, ninth, eleventh, thirteenth, and fifteenth spin MOSFETs have gates receiving data formed by inverting the first control data;
the second, fourth, sixth, and the eighth MOSFETs have gates receiving second control data transmitted from the second control line; the first, third, fifth, and seventh MOSFETs have gates receiving data formed by inverting the second control data; the first MOSFET has a source connected to drains of the first and second spin MOSFETs; the second MOSFET has a source connected to drains of the third and fourth spin MOSFETs; the third MOSFET has a source connected to drains of the fifth and sixth spin MOSFETs; the fourth MOSFET has a source connected to drains of the seventh and eighth spin MOSFETs; the fifth MOSFET has a source connected to drains of the ninth and tenth spin MOSFETs; the sixth MOSFET has a source connected to drains of the eleventh and twelfth spin MOSFETs; the seventh MOSFET has a source connected to drains of the thirteenth and fourteenth spin MOSFETs; and the eighth MOSFET has a source connected to drains of the fifteenth and sixteenth spin MOSFETs;
the tenth and twelfth MOSFETs have gates receiving third control data transmitted from the third control line; the ninth and eleventh MOSFETs have gates receiving data formed by inverting the third control data; the ninth MOSFET has a source connected to drains of the first and second MOSFETs; the tenth MOSFET has a source connected to drains of the third and fourth MOSFETs; the eleventh MOSFET has a source connected to drains of the fifth and sixth MOSFETs; and the twelfth MOSFET has a source connected to drains of the seventh and eighth MOSFETs; and
the fourteenth MOSFET has a gate receiving fourth control data transmitted from the fourth control line; the thirteenth MOSFET has a gate receiving data formed by inverting the fourth control data; the thirteenth MOSFET has a source connected to drains of the ninth and tenth MOSFETs, and a drain connected to the first input terminal of the differential amplifier circuit; and the fourteenth MOSFET has a source connected to drains of the eleventh and twelfth MOSFETs, and a drain connected to the first input terminal of the differential amplifier circuit.

6. The circuit according to claim 2, wherein each of the first and second current supply sources is a circuit that is formed with two p-type MOSFETs connected in series.

7. The circuit according to claim 5, wherein the reference portion is a circuit that is formed with three n-type MOSFETs and an n-type spin MOSFET connected in series.

8. The circuit according to claim 5, wherein the reference portion has a series circuit and a parallel circuit connected in series, the series circuit having three n-type MOSFETs connected in series, the parallel circuit having two n-type spin MOSFETs connected in parallel.

9. The circuit according to claim 5, wherein:
the reference portion includes a first series circuit that has three n-type MOSFETs connected in series, a second series circuit that has two n-type spin MOSFETs connected in series, and a third series circuit that has two n-type spin MOSFETs connected in series; and
a parallel circuit that has the second and third series circuits connected in parallel is connected in series to the first series circuit.

10. The circuit according to claim 1, further comprising:
a reference portion which generates a reference potential when a current is supplied;
a first current supply source which supplies a negative current to the selected spin MOSFET, based on a clock signal; and
a second current supply source which supplies a negative current to the reference portion, based on the clock signal,
wherein the determining circuit includes a differential amplifier circuit that has a first input terminal connected to the first current supply source and a second input terminal connected to the second current supply source, and amplifies and outputs a difference between a first potential and a second potential, the first potential being generated at the first input terminal when the first current supply source supplies the negative current to the selected spin MOSFET, the second potential being the reference potential and being generated at the second input terminal when the second current supply source supplies the negative current to the reference portion.

11. The circuit according to claim 10, wherein:
the spin MOSFETs are p-type spin MOSFETs; and
the MOSFETs in the selecting portion are p-type MOSFETs.

12. The circuit according to claim 11, wherein:
the plurality of control lines are first to fourth control lines; the plurality of spin MOSFETs are p-type first to sixteenth spin MOSFETs; and the selecting portion includes p-type first to fourteenth MOSFETs;
the first to sixteenth spin MOSFETs have sources connected to one another; the second, fourth, sixth, eighth, tenth, twelfth, fourteenth, and sixteenth spin MOSFETs have gates receiving first control data transmitted from the first control line; and the first, third, fifth, seventh, ninth, eleventh, thirteenth, and fifteenth spin MOSFETs have gates receiving data formed by inverting the first control data;
the second, fourth, sixth, and the eighth MOSFETs have gates receiving second control data transmitted from the second control line; the first, third, fifth, and seventh MOSFETs have gates receiving data formed by inverting the second control data; the first MOSFET has a source connected to drains of the first and second spin MOSFETs; the second MOSFET has a source connected to drains of the third and fourth spin MOSFETs; the third MOSFET has a source connected to drains of the fifth and sixth spin MOSFETs; the fourth MOSFET has a source connected to drains of the seventh and eighth spin MOSFETs; the fifth MOSFET has a source connected to drains of the ninth and tenth spin MOSFETs; the sixth MOSFET has a source connected to drains of the eleventh and twelfth spin MOSFETs; the seventh MOSFET has a source connected to drains of the thirteenth and fourteenth spin MOSFETs; and the eighth MOSFET has a source connected to drains of the fifteenth and sixteenth spin MOSFETs;

the tenth and twelfth MOSFETs have gates receiving third control data transmitted from the third control line; the ninth and eleventh MOSFETs have gates receiving data formed by inverting the third control data; the ninth MOSFET has a source connected to drains of the first and second MOSFETs; the tenth MOSFET has a source connected to drains of the third and fourth MOSFETs; the eleventh MOSFET has a source connected to drains of the fifth and sixth MOSFETs; and the twelfth MOSFET has a source connected to drains of the seventh and eighth MOSFETs; and the fourteenth MOSFET has a gate receiving fourth control data transmitted from the fourth control line; the thirteenth MOSFET has a gate receiving data formed by inverting the fourth control data; the thirteenth MOSFET has a source connected to drains of the ninth and tenth MOSFETs, and a drain connected to the first input terminal of the differential amplifier circuit; and the fourteenth MOSFET has a source connected to drains of the eleventh and twelfth MOSFETs, and a drain connected to the first input terminal of the differential amplifier circuit.

13. The circuit according to claim 10, wherein each of the first and second current supply sources is a circuit that is formed with two n-type MOSFETs connected in series.

14. The circuit according to claim 12, wherein the reference portion is a circuit that is formed with three p-type MOSFETs and a p-type spin MOSFET connected in series.

15. The circuit according to claim 12, wherein the reference portion has a series circuit and a parallel circuit connected in series, the series circuit having three p-type MOSFETs connected in series, the parallel circuit having two p-type spin MOSFETs connected in parallel.

16. The circuit according to claim 12, wherein:
the reference portion includes a first series circuit that has three p-type MOSFETs connected in series, a second series circuit that has two p-type spin MOSFETs connected in series, and a third series circuit that has two p-type spin MOSFETs connected in series; and
a parallel circuit that has the second and third series circuits connected in parallel is connected in series to the first series circuit.

* * * * *